United States Patent
Tsorng et al.

(10) Patent No.: US 11,297,730 B1
(45) Date of Patent: Apr. 5, 2022

(54) TOOL FREE REMOVABLE CHASSIS COVER

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Shin-Ming Su, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/086,676

(22) Filed: Nov. 2, 2020

(51) Int. Cl.
*H05K 7/14* (2006.01)

(52) U.S. Cl.
CPC ......... *H05K 7/1489* (2013.01); *H05K 7/1402* (2013.01)

(58) Field of Classification Search
None
See application file for complete search history.

(56) References Cited

U.S. PATENT DOCUMENTS

| | | | | |
|---|---|---|---|---|
| 6,174,007 B1* | 1/2001 | Schlack | ..................... | E05B 5/00 292/336.3 |
| 6,373,692 B1* | 4/2002 | Cheng | ..................... | G06F 1/181 220/4.02 |
| 6,398,325 B1* | 6/2002 | Chen | ..................... | G06F 1/181 292/128 |
| 6,407,912 B1* | 6/2002 | Chen | ..................... | G06F 1/181 312/223.1 |
| 6,616,201 B1* | 9/2003 | Liang | ..................... | E05C 19/08 292/207 |
| 6,711,009 B2* | 3/2004 | Lee | ..................... | G06F 1/181 248/551 |
| 6,721,183 B1* | 4/2004 | Chen | ..................... | G06F 1/181 16/404 |
| 6,775,144 B2* | 8/2004 | Gan | ..................... | G06F 1/181 312/223.1 |
| 6,824,174 B2* | 11/2004 | Lin | ..................... | E05B 63/248 16/110.1 |
| 6,917,518 B2* | 7/2005 | Chen | ..................... | G06F 1/181 361/724 |
| 6,929,338 B2* | 8/2005 | Chang | ..................... | G06F 1/181 312/223.2 |
| 7,180,013 B2* | 2/2007 | Peng | ..................... | H05K 5/0013 174/541 |
| 7,193,855 B2* | 3/2007 | Fan | ..................... | G06F 1/183 312/223.2 |

(Continued)

*Primary Examiner* — Xanthia C Cunningham
(74) *Attorney, Agent, or Firm* — Nixon Peabody LLP

(57) ABSTRACT

A computer chassis can include a top cover that can be secured and removed without the need for tools. Sidewalls of a chassis base can include receiving slots that receive bosses of the top cover. A latch receiver mounted to a bottom surface of the chassis base can receive a sliding body of a latch assembly of the top cover. The computer chassis can be assembled by placing the top cover on the chassis base such that the bosses are placed into the receiving slots, and such that the sliding body fits within the latch receiver. In this position, rotation of a lever of the latch assembly can force the top cover to move with respect to the chassis base, pushing the bosses of the top cover towards distal ends of the receiving slots of the chassis base, thus securing the top cover to the chassis base.

22 Claims, 23 Drawing Sheets

(56) References Cited

U.S. PATENT DOCUMENTS

| | | | | |
|---|---|---|---|---|
| 7,325,846 | B2* | 2/2008 | Smith | E05C 19/006 |
| | | | | 292/137 |
| 8,270,173 | B2* | 9/2012 | Chang | H05K 5/0221 |
| | | | | 361/726 |
| 8,837,129 | B2* | 9/2014 | Fu | H05K 7/1487 |
| | | | | 361/679.02 |
| 8,899,702 | B2* | 12/2014 | Mao | H05K 5/0239 |
| | | | | 312/332.1 |
| 9,055,689 | B2* | 6/2015 | Yu | H05K 7/1487 |
| 9,207,721 | B2* | 12/2015 | Conn | E05B 65/006 |
| 9,253,902 | B2* | 2/2016 | Tsuchida | H05K 5/0217 |
| 9,575,518 | B2* | 2/2017 | Geng | G06F 1/182 |
| 9,696,769 | B1* | 7/2017 | Hamilton | F16B 1/00 |
| 9,788,442 | B2* | 10/2017 | Li | H05K 5/0221 |
| 10,619,386 | B2* | 4/2020 | Chen | E05B 65/006 |
| 10,624,223 | B1* | 4/2020 | Tsorng | H05K 5/03 |
| 10,869,403 | B2* | 12/2020 | Tsorng | H05K 7/1487 |
| 2004/0021325 | A1* | 2/2004 | Schlack | H05K 7/1409 |
| | | | | 292/110 |
| 2005/0013105 | A1* | 1/2005 | Lin | G06F 1/181 |
| | | | | 361/679.58 |
| 2010/0007252 | A1* | 1/2010 | Liu | H05K 7/1487 |
| | | | | 312/223.2 |
| 2014/0001942 | A1* | 1/2014 | Mao | H05K 5/0239 |
| | | | | 312/333 |
| 2017/0280581 | A1* | 9/2017 | Hesse | H05K 7/1487 |
| 2019/0363483 | A1* | 11/2019 | Gomez | H05K 5/03 |

* cited by examiner

TOOL FREE REMOVABLE CHASSIS COVER

TECHNICAL FIELD

The present disclosure relates to computer systems generally and more specifically to computer chassis assemblies.

BACKGROUND

In many computing systems, especially rack-mounted systems, a computer chassis can include a base and a top cover. Generally, the top cover is coupled to the base through the use of screws or bolts, requiring the use of tools to assemble or disassemble. While this method of fixing the top cover is commonplace, it is inconvenient for installers and maintenance workers; requires the use of small parts that can be easily lost and misplaced (and potentially dislodged due to vibration); and increases downtime when there is a need for maintenance requiring removal of the top cover.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a computer chassis that comprises a chassis base for receiving a motherboard. The chassis base has a bottom surface and a set of sidewalls. The chassis base further includes slots at upper edges of the set of sidewalls. Each of the receiving slots includes a slot channel extending from a slot opening to a slot distal end. The computer chassis further comprises a top cover removably couplable to the chassis base. The top cover includes a set of bosses. Each boss of the set of bosses corresponds to a respective receiving slot of the chassis base. The top cover further includes a latch assembly having a sliding body rotatable about a latch pivot between an open position and a closed position. The computer chassis further comprises a latch receiver coupled to the bottom surface of the chassis base. The latch receiver includes a latch receiver channel extending from a latch receiver that opens to a latch receiver channel distal end. In some cases, the top cover is moveable through an intermediate position between an uncoupled position and a secured position. When the top cover is in the uncoupled position, the top cover is not coupled to the chassis base. When the top cover is in the intermediate position, i) the sliding body is received by the latch receiver; ii) each boss of the set of bosses is received by the slot opening of the respective receiving slot of the chassis base; and iii) the sliding body is in the open position. When the top cover is in the secured position, i) the sliding body is in a closed position, and ii) each boss of the set of bosses is located at the slot distal end of the respective receiving slot of the chassis base.

In some cases, each of the receiving slots comprises a resting surface parallel to the bottom surface of the chassis base. Each boss of the set of bosses of the top cover rests upon a resting surface of the respective receiving slot of the chassis base when the top cover is in the intermediate position. In some cases, each receiving slot of the receiving slots is shaped such that movement of the top cover from the intermediate position to the secured position moves the top cover towards a front end of the chassis base. In some cases, the receiving slots comprise a first set of receiving slots on a first sidewall of the set of sidewalls and a second set of receiving slots on a second sidewall of the set of sidewalls. In some cases, locations of the first set of receiving slots along the first sidewall are aligned with locations of the second set of receiving slots along the second sidewall. In some cases, locations of the first set of receiving slots along the first sidewall are staggered with respect to locations of the second set of receiving slots along the second sidewall.

In some cases, the latch receiver comprises an opening for passing cables from a front end of the latch receiver to a rear end of the latch receiver. The opening of the latch receiver is positioned between the bottom surface of the chassis base and the latch receiver channel distal end. In some cases, the latch receiver further comprises a receiving slot, and the top cover further comprises a securement feature extending from an underside of the top cover. The securement feature of the top cover engages the receiving slot of the latch receiver when the top cover is in the secured position. In some cases, the receiving slot of the latch receiver is oriented parallel to the bottom surface of the chassis base.

In some cases, the chassis base further comprises a supplemental receiving slot, and the top cover further comprises a securement feature extending from an underside of the top cover. The securement feature of the top cover engages the supplemental receiving slot of the chassis base when the top cover is in the secured position. In some cases, the supplemental receiving slot is positioned on a bracket extending from a first sidewall of the set of sidewalls to a second sidewall of the set of sidewalls.

In some cases, the top cover further comprises a bracket extending from an underside of the top cover. The bracket includes a receiving slot. The chassis base further comprises a securement feature extending from a sidewall of the set of sidewalls. The securement feature of the chassis base engages the receiving slot of the top cover when the top cover is in the secured position.

In some cases, the latch assembly further comprises a latch body. The latch body supports the sliding body about the latch pivot. The latch body includes a lock receiver. In some cases, the latch assembly further comprises a lever for rotating the sliding body between the open position and the closed position. The lever includes a lock body movable between an unlocked position and a locked position. The lock body engages the lock receiver in the locked position to prevent the lever from rotating the sliding body to the open position.

In some cases, the latch assembly further comprises a latch body supporting the sliding body about the latch pivot. The latch assembly further comprises a lever rotatably coupled to the latch body about the latch pivot for rotating the sliding body between the open position and the closed position. The lever includes a capture tab. The latch assembly further comprises a release tab coupled to the latch body about a release pivot. The release tab is rotatable about the release pivot between a capturing position and a releasing position. The release tab is biased towards the capturing position. The release tab engages the capture tab of the lever when in the capturing position. The release tab disengages the capture tab of the lever when in the releasing position.

Embodiments of the present disclosure include a method for assembling a computer chassis. The method comprises providing a chassis base having a bottom surface and a set of sidewalls. The chassis base includes a latch receiver coupled to the bottom surface. The latch receiver includes a latch receiver channel extending from a latch receiver opening to a latch receiver channel distal end. The chassis base further includes receiving slots at upper edges of the set of sidewalls. Each receiving slot of the receiving slots comprises a slot channel extending from a slot opening to a slot distal end. The method further comprises providing a top cover. The top cover includes a latch assembly having a sliding body rotatable about a latch pivot between an open position and a closed position. The top cover further includes a set of bosses corresponding to respective receiving slots of the chassis base. The method further comprises placing the top cover on the chassis base. Placing the top cover on the chassis base comprises inserting each boss of the set of bosses into the slot opening of the respective receiving slot of the chassis base. Placing the top cover on the chassis base further comprises inserting the sliding body of the top cover into the latch receiver channel of the chassis base when the sliding body is in the open position. Placing the top cover on the chassis base results in the top cover being in an intermediate position. The method further comprises securing the top cover by moving the top cover from the intermediate position to a secured position. Securing the top cover comprises rotating the sliding body from the open position to the closed position. Rotating the sliding body to the closed position causes each boss of the set of bosses to move towards the distal end of the respective receiving slot of the chassis base.

In some cases, each receiving slot of the receiving slots comprises a resting surface parallel to the bottom surface of the chassis base, wherein each boss of the set of bosses of the top cover rests upon the resting surface of the respective receiving slot of the chassis base when the top cover is in the intermediate position. In some cases, each receiving slot of the receiving slots is shaped such that rotating the sliding body to the closed position causes the top cover to move towards a front end of the chassis base.

In some cases, moving the top cover from the intermediate position to the secured position further comprises sliding a supplemental securement feature into a supplemental receiving slot. In some cases, the supplemental securement feature extends from an underside of the top cover, and the supplemental receiving slot is located on the chassis base. In some cases, the supplemental receiving slot of the chassis base is parallel to the bottom surface of the chassis base. In some cases, the supplemental securement feature is located on a sidewall of the set of sidewalls of the chassis base, and the supplemental receiving slot is located on a bracket extending from an underside of the top cover. In some cases, the supplemental receiving slot of the top cover can be perpendicular to the bottom surface of the chassis base.

In some cases, the latch assembly further comprises a latch body supporting a lever about the latch pivot. The lever is coupled to the sliding body for rotating the sliding body between the open position and the closed position. The method further comprises locking the top cover in the secured position by moving a lock body of the lever into a locked position. The lock body of the lever engages a lock receiver of the latch body when the lock body is in the locked position.

In some cases, the method further comprises removing the top cover from the chassis base. Removing the top cover from the chassis base can include moving the top cover from the secured position to the intermediate position by rotating the sliding body from the closed position to the open position. Removing the top cover from the chassis base can further include separating the top cover from the chassis base by lifting each boss of the set of bosses out of the respective receiving slot of the chassis base. In some cases, rotating the sliding body from the closed position to the open position further includes depressing a release tab of the latch assembly to disengage a lever of the latch assembly. The lever being coupled to the sliding body to rotate the sliding body about the latch pivot. Rotating the sliding body from the closed position to the open position further includes rotating the lever about the latch pivot to rotate the sliding body towards the open position.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
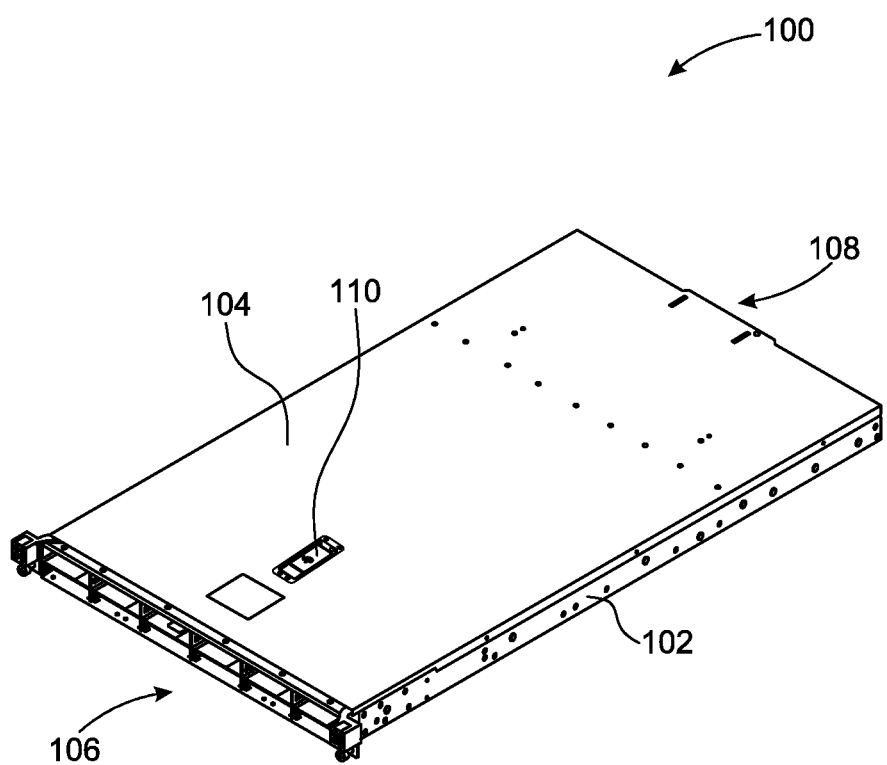
FIG. 1 is an axonometric projection of a computer chassis with a removable top cover coupled to a chassis base, according to certain aspects of the present disclosure.

Certain aspects and features of the present disclosure relate to a computer chassis having a top cover that can be secured and removed without the need for tools. Sidewalls of a chassis base can include receiving slots that receive bosses of the top cover. A latch receiver mounted to a bottom surface of the chassis base can receive a sliding body of a latch assembly of the top cover. The computer chassis can be assembled by placing the top cover on the chassis base such that the bosses are placed into the receiving slots, and such that the sliding body fits within the latch receiver. In this position, rotation of a lever of the latch assembly can force the top cover to move with respect to the chassis base, thus pushing the bosses of the top cover towards distal ends of the receiving slots of the chassis base, and securing the top cover to the chassis base.

The disclosed computer chassis can permit users to quickly and easily assemble or disassemble the chassis, even without the need to use tools such as screwdrivers and the like. The computer chassis can include a chassis base and a top cover. The chassis base and top cover can be made in any suitable sizes. Computer components, such as a motherboard, add-on cards, storage devices, processing devices, fans, power supplies, interface cards, and the like, can be mounted to the chassis base (e.g., directly mounted, such as a motherboard, or indirectly mounted, such as an add-on card mounted via a motherboard). To access the inside of the computer chassis (e.g., for maintenance, initial assembly, or disassembly), the top cover can be separated from the chassis base.

The chassis base can include sidewalls, such as a left sidewall and a right sidewall. Each sidewall can extend from a bottom surface of the chassis base up to an upper edge of the sidewall. In some cases, the sidewalls and bottom surface of the chassis base are made of a single piece of material, although that need not always be the case. In some cases, sidewalls and the bottom surface of the chassis base can be made of separate pieces of material that are coupled together.

Receiving slots can be located at and along the upper edge of each sidewall. Each receiving slot can start at a slot opening at the upper edge of the sidewall and extend along a slot channel until ending at a distal end. The distal end of each slot channel is located between the upper edge of the sidewall and the bottom surface of the chassis base, and between the slot opening and a front end or rear end of the chassis. In other words, each slot channel extends downwards from the upper edge of the sidewall and towards either the front end or the rear end of the chassis. All receiving slots will extend in the same direction (e.g., either towards the front end of the chassis or towards the rear end of the chassis). Slot channels can have a linear shape or a non-linear shape. In some cases, the slot channels can include a resting surface, such that a boss entering the slot channel can rest on the resting surface until forced towards the distal end of the slot channel. The resting surface can be parallel to the bottom surface of the chassis base.

The top cover can include bosses that correspond to the receiving slots of the sidewalls (e.g., each boss is associated with a particular receiving slot). The bosses can be located on sidewalls of the top cover. The distance between the inner surfaces of the sidewalls of the top cover can be approximately the same or greater than the distance between the outer surfaces of the sidewalls of the chassis base. Thus, when the top cover is placed on the chassis base, the sidewalls of the top cover are located outside of the sidewalls of the chassis base. The bosses of the top cover extend from the inner surfaces of the sidewalls of the top cover, such that the bosses can engage (e.g., enter) the receiving slots of the sidewalls of the chassis base when the top cover is placed on the chassis base. Bosses can be of any suitable shape, size, or style. Bosses can be made of the same piece of material as the sidewall of the top cover or be made of separate pieces of material coupled to the sidewall. As used herein, the term "boss" is inclusive of any protrusion that can engage the receiving slots of the chassis base. Examples of suitable bosses include riveted standoffs, bolt heads or shafts, embossed or stamped features of the sidewalls, or the like. In some cases, bosses can be coupled to the top cover by a bracket instead of a sidewall. For example, in some cases, an inner bracket can include bosses that extend from a centerline of the chassis outwards to the sidewalls, in which case the inner bracket can be positioned to fit adjacent the inner surface of the sidewall of the chassis base.

Thus, to bring the top cover and the chassis base together, the top cover can be lowered down while the bosses of the top cover are aligned with their respective receiving slots. Lowering completely allows the bosses of the top cover to enter the slot channels of the receiving slots. In this position, the top cover can be considered to be in an intermediate position. In some cases, when the top cover is in an intermediate position, the top cover can be separated from the chassis base by applying force only in an upwards direction.

When in the intermediate position, the top cover can be secured to the chassis base by sliding it with respect to the chassis base in either a forward direction (e.g., towards a front end of the chassis base) or a rearward direction (e.g., towards a rear end of the chassis base), depending on the direction of the slot channels. Movement in this fashion can move the top cover from an intermediate position to a secured position. In some cases, the slot channels can be inclined to force the top cover towards the chassis base as the top cover is moved from the intermediate position towards the secured position.

In some cases, the top cover and chassis base can include tongues and grooves (e.g., at a rear end of the top cover and/or at a front end of the top cover) that interact with one another to further secure the top cover to the chassis base when the top cover is moved from an intermediate position to a secured position. The use of such tongues and grooves can provide additional structural integrity, as well as close potential air gaps that may otherwise be left open to airflow.

Additionally, in some cases, supplemental securement features can be used to further secure the top cover to the chassis base when moving the top cover from the intermediate position to the secured position. Supplemental securement features on either the top cover or the chassis base can engage receiving slots on the other of the top cover and the chassis base. For example, the top cover can include a supplemental securement feature extending from an underside of the top cover. This supplemental securement feature can include a shaft and a shoulder. The supplemental securement feature can engage a receiving slot of the chassis base, such as a receiving slot located on a part secured to the chassis base (e.g., located on a latch receiver as disclosed herein or located on a frame element coupled to the chassis base). The shaft of the supplemental securement feature can fit within the receiving slot, with the shoulder remaining on the opposite side of the receiving slot from the top cover, thus securing the top cover from being moved away from the chassis base. In some cases, the receiving slot can be inclined to force the top cover towards the chassis base as the top cover is moved from the intermediate position towards the secured position.

In another example, the chassis base can include a supplemental securement feature extending (e.g., inwards) from a sidewall. This supplemental securement feature can include a shaft and a shoulder. The supplemental securement feature can engage a receiving slot of the top cover, such as a receiving slot of a bracket coupled to the top cover. The shaft of the supplemental securement feature can fit within the receiving slot, with the shoulder remaining on the opposite side of the receiving slot from the sidewall of the chassis base, thus further securing the top cover to the chassis base.

A latch assembly can be used to achieve movement of the top cover from the intermediate position to the secured position. The latch assembly can be located on the top cover and can include a sliding body that pivots about a latch pivot between an open position and a closed position. The sliding body can be a solid or movable part (e.g., a rotating bearing) that is capable of sliding vertically within a latch receiver of the chassis base. The sliding body can be located under the top cover (e.g., within the boundaries of the computer chassis when assembled). To move the sliding body, a lever can be coupled to the sliding body. The lever and sliding body can be formed of a single piece of material rotatable coupled at the latch pivot, although that need not always be the case. The latch assembly can be configured such that movement of the lever towards a position parallel with the top cover can move the sliding body towards a closed position, whereas movement of the lever towards a position perpendicular with the top cover can move the sliding body towards an open position. In some cases, a release tab can be used to releasably hold the lever in the closed position. Depressing the release tab can disengage the release tab from a capture tab (e.g., a lip) of the lever, thus permitting the lever to move towards a position perpendicular with the top cover. In some cases, an additional locking element can be used to lock the lever in the closed position, regardless of movement of the release tab. This additional locking element can be useful to keep the top cover closed and secured even when subjected to impacts, such as during transportation or handling of the computer chassis. In some cases, the top cover is configured such that the lever assembly fits within a recess of the top cover. In some cases, the top surface of the top cover is coplanar with the top surface of the lever when the lever is in a closed position.

The chassis base can include the latch receiver, which can be mounted to the bottom surface of the chassis or otherwise mounted in the chassis. In some cases, the latch receiver is located along a centerline of the chassis base, although that need not always be the case. The latch receiver can include a receiver channel for receiving the sliding body of the latch assembly. The receiver channel can extend from a receiver opening and towards the bottom surface of the chassis base. The receiver channel can have a distal end opposite the receiver opening, which can be an open end or a closed end.

Placing the top cover onto the chassis base (e.g., moving the top cover from an uncoupled position to an intermediate position) includes inserting sliding body of the latch assembly into the receiver channel when the latch assembly is in an open position. If the latch assembly is not in an open position, the top cover cannot be fully placed on the chassis base because of interaction between the sliding body of the latch assembly and the body of the latch receiver. Because the sliding body is retained within the receiver channel, the sliding body is held linearly fixed with respect to forward and/or rearward movement with respect to the chassis base. In other words, as long as the sliding body is retained within the receiver channel, it cannot move closer to the front end or rear end of the chassis. Thus, pressure applied to the lever to move the sliding body from the open position to the closed position results in translation of the top cover in a forward or rearward direction. For example, when receiving slots of the sidewalls of the chassis base extend towards a front end of the chassis base, pressure applied to the lever to move the sliding body from the open position to the closed position results in translation of the top cover towards a front end of the chassis base, thus moving the top cover to the secured position. The distance between the latch pivot and sliding body can define the translation distance of the top cover. The latch assembly can be configured such that movement of the lever to a closed position parallel to the top cover results in movement of the top cover to the secured position.

In some cases, the latch receiver includes a supplemental slot for receiving a supplemental securement feature of the top cover. Thus, when the top cover is moved to a secured position, the top cover is further secured at a location adjacent the latch receiver.

In some cases, the latch receiver further includes a pass-through (e.g., an opening) for passing cables and the like. The pass-through can permit cables to pass from a front portion of the chassis base, through the pass-through, to a rear portion of the chassis base. The pass-through can be an enclosed opening (e.g., an "O" shape) or a non-enclosed opening (e.g., a "C" shape). The pass-through can be positioned such that it is between the bottom surface of the chassis base and the latch receiver channel distal end. In other words, the latch receiver channel can extend to a location before the bottom surface of the chassis base. The pass-through can be very useful, especially for latch receivers mounted within chassis bases, since often other components may be placed on opposite sides of the latch receiver, thus making cable management difficult without a path to route cables from a front portion of the chassis base to a rear portion of the chassis base.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is an axonometric projection of a computer chassis 100 with a removable top cover 104 coupled to a chassis base 102, according to certain aspects of the present disclosure. The chassis base 102 can have a front end 106 and a rear end 108. The top cover 104 can be depicted as being coupled to the chassis base 102 in a secured position. A latch assembly 110 is seen on the top cover 104.

As used herein, the direction from the rear end 108 towards the front end 106 can be considered the forward direction, which is opposite a rearward direction. The examples depicted herein depict a top cover 104 that moves in the forward direction to move from an intermediate position to a secured position. However, other embodiments can be configured to allow a top cover to move in a rearward direction to move from an intermediate position to a secured position.

As depicted in FIG. 1, the chassis base 102 can include openings at its front end 106 for receiving computer components or modules, such as storage devices, interface cards, and the like. Similarly, openings at the rear end 108 can receive computer components or modules. When the computer chassis 100 is in use, all of these openings are generally occupied by computer components. To access the computer components within the computer chassis 100, the top cover 104 is removed. Removal of the top cover 104 can include moving the top cover 104 from a secured position to an intermediate position, then from the intermediate position to an uncoupled (e.g., separated) position.

Figure 2:
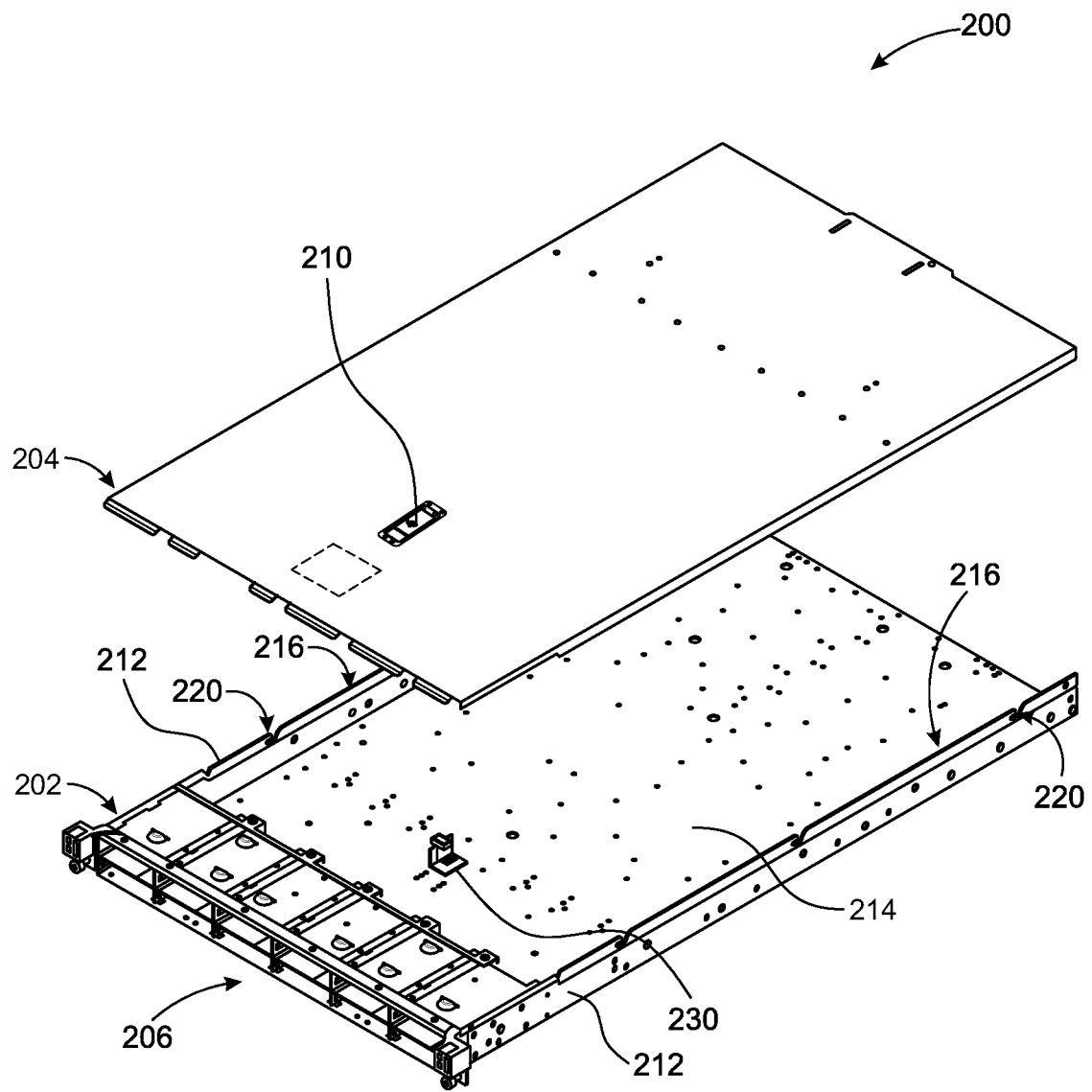
FIG. 2 is an axonometric projection of a computer chassis with a removable top cover separated from a chassis base, according to certain aspects of the present disclosure.

FIG. 2 is an axonometric projection of a computer chassis 200 with a removable top cover 204 separated from a chassis base 202, according to certain aspects of the present disclosure. Computer chassis 200 can be any suitable computer chassis, such as computer chassis 100 of FIG. 1.

Chassis base 202 can include a bottom surface 214 and sidewalls 212 (e.g., a pair of sidewalls, such as left and right sidewalls). Each sidewall 212 can include receiving slots 220 at the upper edge 216 of the sidewall. As depicted in FIG. 2, the receiving slots 220 extend in a direction towards the front end 206 of the chassis base.

Chassis base 202 further includes a latch receiver 230. Latch receiver 230 can be mounted to the bottom surface 214 of the chassis base 202 or otherwise coupled to the chassis base 202. Latch receiver 230 is held fixed with respect to the chassis base 202.

Top cover 204 includes a latch assembly 210. Latch assembly 210 is depicted in a closed position, but can be moved to an open position to move the top cover 204 from the uncoupled position to the intermediate position. Latch assembly 210 and latch receiver 230 can be respectively positioned on the top cover 204 and chassis base 202 such that latch assembly 210 engages latch receiver 230 upon movement of the top cover 204 from the uncoupled position to the intermediate position. In some cases, latch assembly 210 and latch receiver 230 are positioned along a centerline of the computer chassis 200, although that need not always be the case. In some cases, latch assembly 210 and latch receiver 230 are positioned between a midpoint and a front end of the computer chassis 200, although that need not always be the case.

Figure 3:
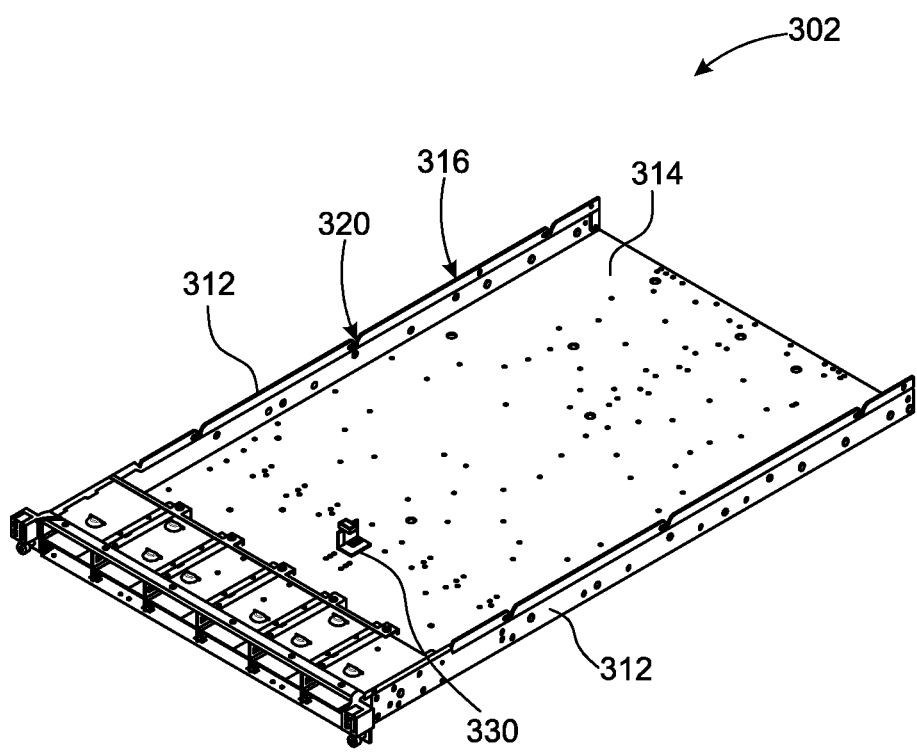
FIG. 3 is an axonometric projection of a chassis base, according to certain aspects of the present disclosure.

FIG. 3 is an axonometric projection of a chassis base 302, according to certain aspects of the present disclosure. Chassis base 302 can be any suitable chassis base, such as chassis base 102 of FIG. 1. Chassis base 302 can include a bottom surface 314 and sidewalls 312. Each sidewall 312 can include receiving slots 320 at the upper edge 316 of the sidewall. Chassis base 302 further includes a latch receiver 330 that is mounted to the bottom surface 314 of the chassis base 302 or otherwise coupled to the chassis base 302.

Figure 4:
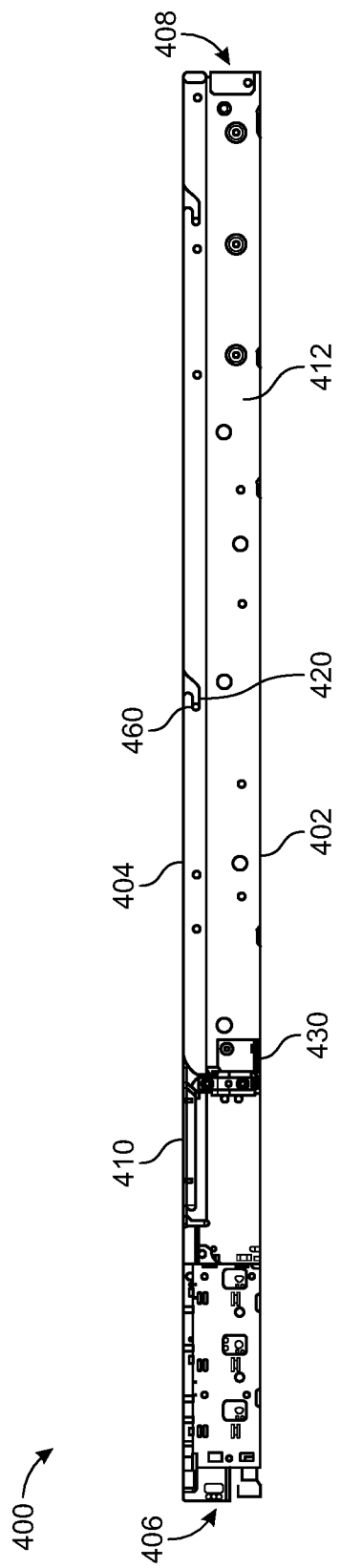
FIG. 4 is a side view of a computer chassis, according to certain aspects of the present disclosure.

FIG. 4 is a side view of a computer chassis 400, according to certain aspects of the present disclosure. Computer chassis 400 can be any suitable computer chassis, such as computer chassis 100 of FIG. 1. For illustrative purposes, the nearest sidewalls of the computer chassis 400 are not depicted, permitting view of the latch receiver 430 within the computer chassis 400 and the inner surface of the far sidewall 412.

Computer chassis 400 can include a top cover 404 coupled to a chassis base 402. Top cover 404 can be in a secured position. In the secured position, bosses 460 of the top cover 404 are engaged within receiving slots 420 of the chassis base 402. The latch assembly 410 of the top cover 404 is engaged with the latch receiver 430 of the chassis base 402. The latch assembly 410 is in a closed position.

In the secured position, the top cover 404 is fully translated towards the front end 406 of the chassis base 402. To move the top cover 404 from the secured position to an intermediate position, the latch assembly 410 can be moved to an open position, thus translating the top cover 404 towards the rear end 408 of the chassis base 402.

Figure 5:
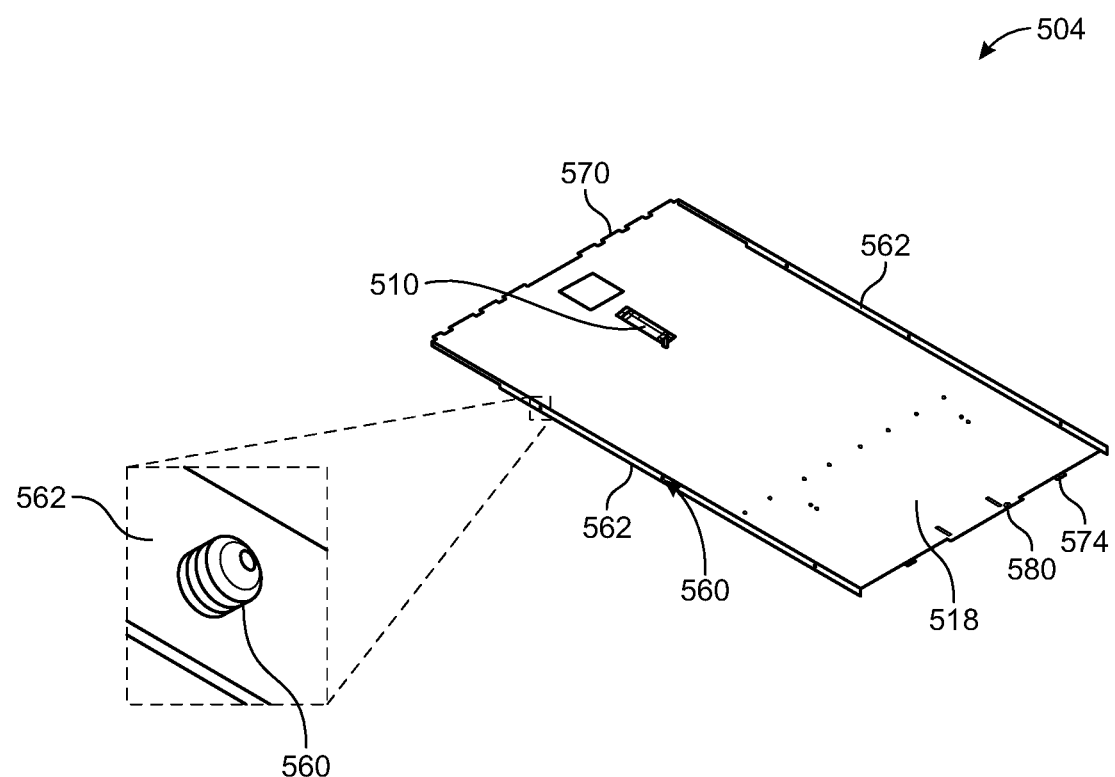
FIG. 5 is a combination axonometric projection and expanded view of the underside of a removable top cover, according to certain aspects of the present disclosure.

FIG. 5 is a combination axonometric projection and expanded view of the underside 518 of a removable top cover 504, according to certain aspects of the present disclosure. Top cover 504 can be any suitable top cover, such as top cover 104 of FIG. 1. For illustrative purposes, the underside 518 of top cover 504 is shown.

Top cover 504 can include sidewalls 562. Sidewalls 562 can extend generally perpendicular to the surface of the top cover 504. Bosses 560 extend inwardly (e.g., towards a centerline of the computer chassis or top cover) from the sidewalls 562. Each boss 560 is located in a position that corresponds to respective receiving slots of a chassis base. Each boss 560 extends for a distance suitable to engage the receiving slots of the chassis base when the top cover 504 is placed in the intermediate position. Bosses 560 can be coupled to sidewalls 562 (e.g., with a rivet) or otherwise formed from sidewalls 562 (e.g., via stamping or other metal forming). Top cover 504 includes six bosses 560, although any number of bosses 560 can be used.

Latch assembly 510 is seen from the underside 518 of the top cover 504. Latch assembly 510 engages a corresponding latch receiver when the top cover 504 is placed in the intermediate position.

In some cases, top cover 504 can include one or more tongues 570. Tongues 570 can extend from an end of the top cover 504, such as from a front end of the top cover 504, as depicted in FIG. 5. Tongues 570 can fit within corresponding grooves or under corresponding lips of a chassis base when the top cover 504 is moved from an intermediate position to a secured position. The use of tongues 570 can facilitate securing the top cover 504 to the chassis base. Likewise, in some cases, top cover 504 can include one or rear tabs 574. A rear tab 574 can include a portion of material (e.g., metal used to form the top cover 504) that is bent to extend towards a front end of the top cover 504. Thus, a rear tab 574 can engage a corresponding groove or lip of the chassis base when the top cover 504 is moved from an intermediate position to a secured position. The use of rear tabs 574 can facilitate securing the top cover 504 to the chassis base.

In some cases, top cover 504 can include one or more supplemental securement features 580. A supplemental securement feature 580 can take the form of a shoulder coupled to and spaced apart from the underside 518 of the top cover 504, such as by a shaft. For example, supplemental securement feature 580 can be a piece that extends from the underside 518 of the top cover 504 and includes a smaller diameter portion between the underside 518 and a larger diameter portion. The supplemental securement feature 580 can engage a corresponding slot of the chassis base when the top cover 504 is moved from the intermediate position to the secured position. In some cases, a supplemental securement feature 580 is included near a rear end of the top cover 504.

Figure 6:
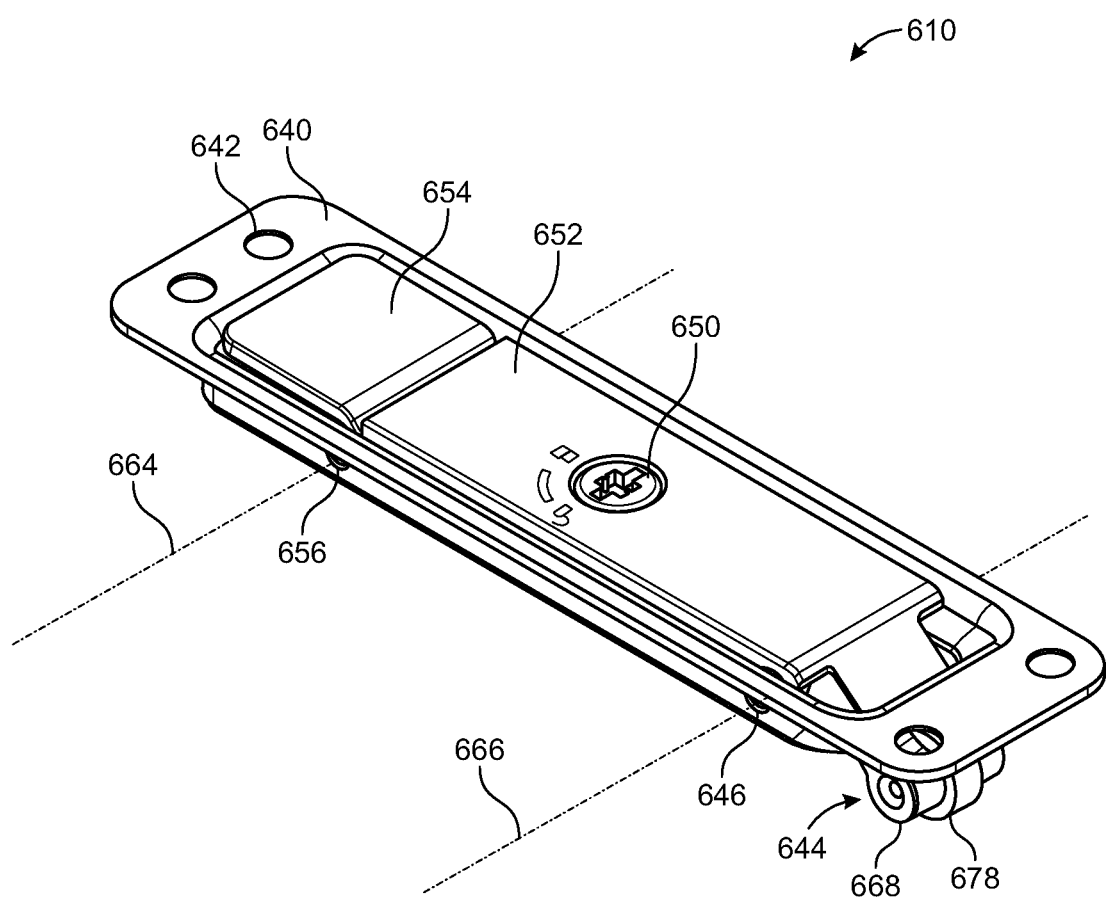
FIG. 6 is an axonometric projection of a latch assembly in a closed position, according to certain aspects of the present disclosure.

FIG. 6 is an axonometric projection of a latch assembly 610 in a closed position, according to certain aspects of the present disclosure. Latch assembly 610 can be any suitable latch assembly, such as latch assembly 110 of FIG. 1. Latch assembly 610 can be mountable onto a top cover. Latch assembly 610 can include mounting holes 642 to facilitate mounting the latch assembly 610 to a top cover.

Latch assembly 610 can include a latch body 640 that supports a sliding body 644 about a latch pivot 646. The sliding body 644 is spaced apart from the latch pivot 646 and can rotate about the latch pivot 646 (e.g., about axis of rotation 666). The sliding body 644 can be coupled to a lever 652 such that movement of the lever 652 about the latch pivot 646 causes movement of the sliding body 644 about latch pivot 646. Lever 652 can extend from the latch pivot 646 by a distance greater than the distance between the latch pivot 646 and the sliding body 644. Thus, lever 652 can provide a mechanical advantage to manipulating the sliding body 644. As used herein, a lever 652 and sliding body 644 being coupled together is inclusive of two separate pieces being coupled together as well as a lever 652 and sliding body 644 being made from a single piece of material (e.g., the lever 652 can be a section of a single piece that is inherently coupled to the sliding body 644, which can be a separate section of the single piece).

In some cases, the sliding body 644 can include a yoke 668 supporting a rotating piece 678 (e.g., a bearing). The rotating piece 678 can rotate within yoke 668, thus reducing friction between the sliding body 644 and a latch receiver in which the sliding body 644 can be located. In some cases, however, a sliding body may not include rotating piece 678. In such cases, the sliding body can naturally slide within a latch receiver and/or slide with the benefit of low-friction surfaces and/or materials.

Lever 652 can be retained in a closed position by release tab 654. Release tab 654 can include a lip that fits over a capture tab located at a distal end (e.g., end furthest from the latch pivot 646) of the lever 652. The release tab 654 can be pivotably mounted about release pivot 656 such that pressure applied to the upper surface of release tab 654 causes the release tab 654 to rotate about axis of rotation 664. The release tab 654 can rotate between a capturing position (as depicted in FIG. 6) and a releasing position. In the capturing position, the lip of release tab 654 fits over the capture tab of the lever 652 to keep the lever 652 in the closed position. A biasing element (e.g., spring) can bias the release tab 654 towards the capturing position. However, upon depressing the release tab 654, the release tab 654 can rotate to the releasing position, allowing the lever 652 to move away from the closed position (e.g., towards the open position). When the release tab 654 is depressed, release tab 654 rotates about axis of rotation 664, causing the lip of the release tab to be moved sufficiently away from the capture tab of the lever 652 such that the lever 652 is able to move from the closed position to the open position. In some cases, lever 652 can be biased (e.g., with a biasing element such as a spring) towards the open position, although that need not always be the case.

Since the release tab 654 acts to release the lever 652 through a pressing action instead of a sliding action, large objects cannot accidentally release lever 652. For example, parts, cables, other chassis, and the like sliding across the top cover would not engage the release tab 654, while the release tab 654 is still very easily engaged by a human digit (e.g., finger or thumb).

The lever 652, when in the closed position, can also be locked in place using locking body 650. Locking body 650 can be engaged or disengaged. Engaging the locking body 650 locks the lever 652 in place against the latch body 640, thus preventing the lever 652 from moving to the open position even if the release tab 654 is depressed. The locking body 650 can be configured to be engaged and/or disengaged without the use of tools (e.g., with a bare hand). In some cases, however, locking body 650 can be configured to require a tool (e.g., a screwdriver or key) to be engaged and/or disengaged. The locking body 650 can help keep unauthorized users out of the insides of the computer chassis and/or can facilitate keeping the computer chassis assembled when impacts are possible (e.g., during transportation).

Figure 7:
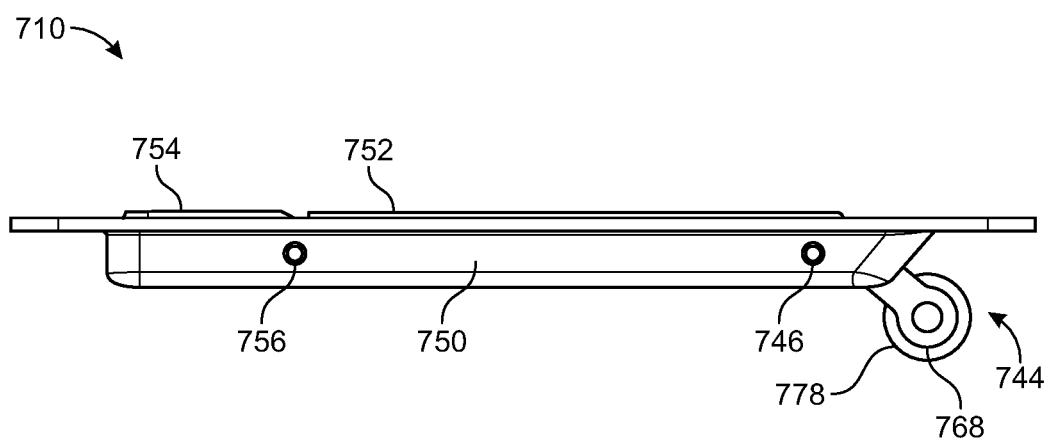
FIG. 7 is a side view of a latch assembly in a closed position, according to certain aspects of the present disclosure.

FIG. 7 is a side view of a latch assembly 710 in a closed position, according to certain aspects of the present disclosure. Latch assembly 710 can by any suitable latch assembly, such as latch assembly 610 of FIG. 6.

Latch body 750 can support the release tab 754 about release pivot 756. Latch body 750 can also support the sliding body 744 and lever 752 about latch pivot 746. In some cases, sliding body 744 can include a yoke 768 and rotating piece 778, although that need not always be the case. In the closed position, lever 752 is at or approximately parallel the top surface of the lever body 750. In some cases, lever 752 can be flush with a top cover when the lever assembly 710 is installed in a top cover, although that need not always be the case.

Figure 8:
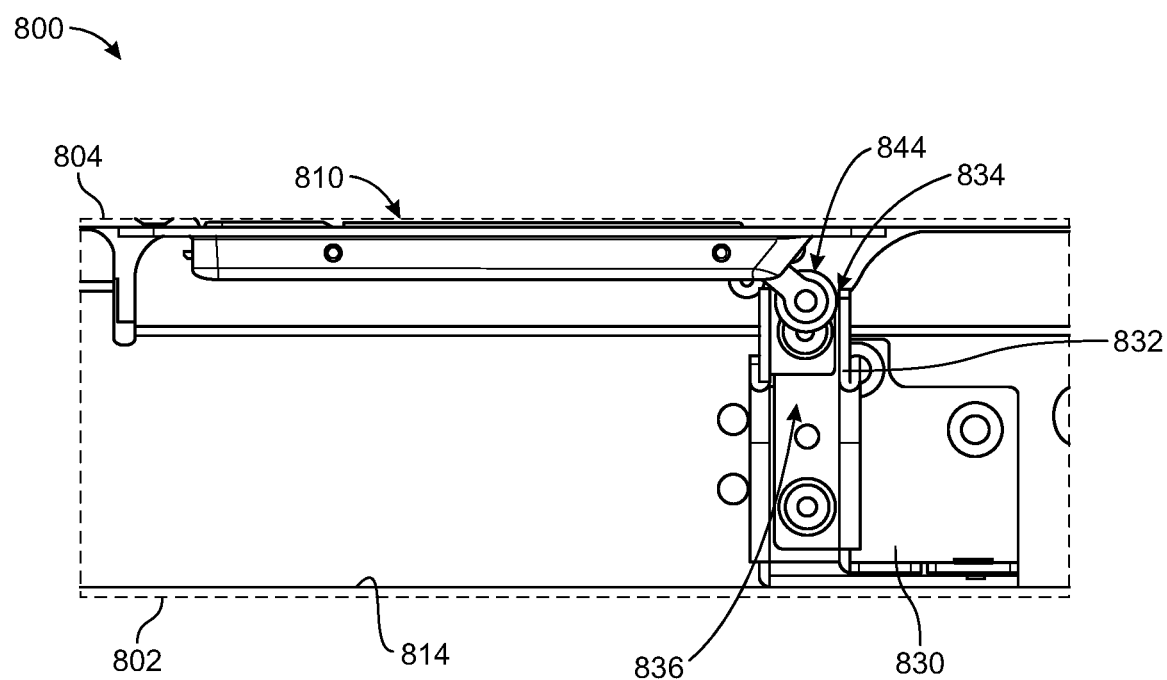
FIG. 8 is a side view of a portion of a computer chassis depicting a latch assembly in a closed position engaging a latch receiver, according to certain aspects of the present disclosure.

FIG. 8 is a side view of a portion of a computer chassis 800 depicting a latch assembly 810 in a closed position engaging a latch receiver 830, according to certain aspects of the present disclosure. Computer chassis 800 can be any suitable computer chassis, such as computer chassis 100 of FIG. 1.

The latch receiver 830 is mounted to a bottom surface 814 of the chassis base 802. The latch receiver 830 includes a receiver channel 832 that accepts a sliding body 844 of a latch assembly 810. The receiver channel 832 has a receiver opening 834 that faces away from the bottom surface 814 of the chassis base 802 (e.g., faces upwards as seen in FIG. 8). The sliding body 844 can enter the receiver channel 832 through the receiver opening 834. The receiver channel 832 also includes a receiver distal end 836 opposite the receiver opening 834. The receiver distal end 836 can be a portion of the receiver channel 832 facing the bottom surface 814 of the chassis base 802. The receiver channel 832 can have a receiver distal end 836 that is open (e.g., as a drinking straw) or closed (e.g., as a bottom of a test tube).

The latch assembly 810 is seen mounted (e.g., flush mounted) to the top cover 804. The top cover 804 is in the secured position with respect to the chassis base 802. In the secured position, the sliding body 844 of the latch assembly 810 is located within the receiver channel 832 of the latch receiver 830. More specifically, when the top cover 804 is in the secured position, the sliding body 844 is located in the receiver channel 832 at a position closer to the receiver opening 834 than when the top cover 804 is in an intermediate position. Since the latch receiver 830 is fixed to the chassis base 802, movement of the latch assembly 810 from a closed position to an open position (e.g., movement of the sliding body 844 from a closed position to an open position) causes the sliding body 844 to move in a downwards direction while the top cover 804 moves in a rearward direction (e.g., a direction from left to right as seen in FIG. 8). The use of a lever to move the sliding body 844 to the open position provides a mechanical advantage to disengage any elements of the top cover 804 and chassis base 802 that may be engaged together (e.g., tongue and groove or tongue and lip engagements).

Figure 9:
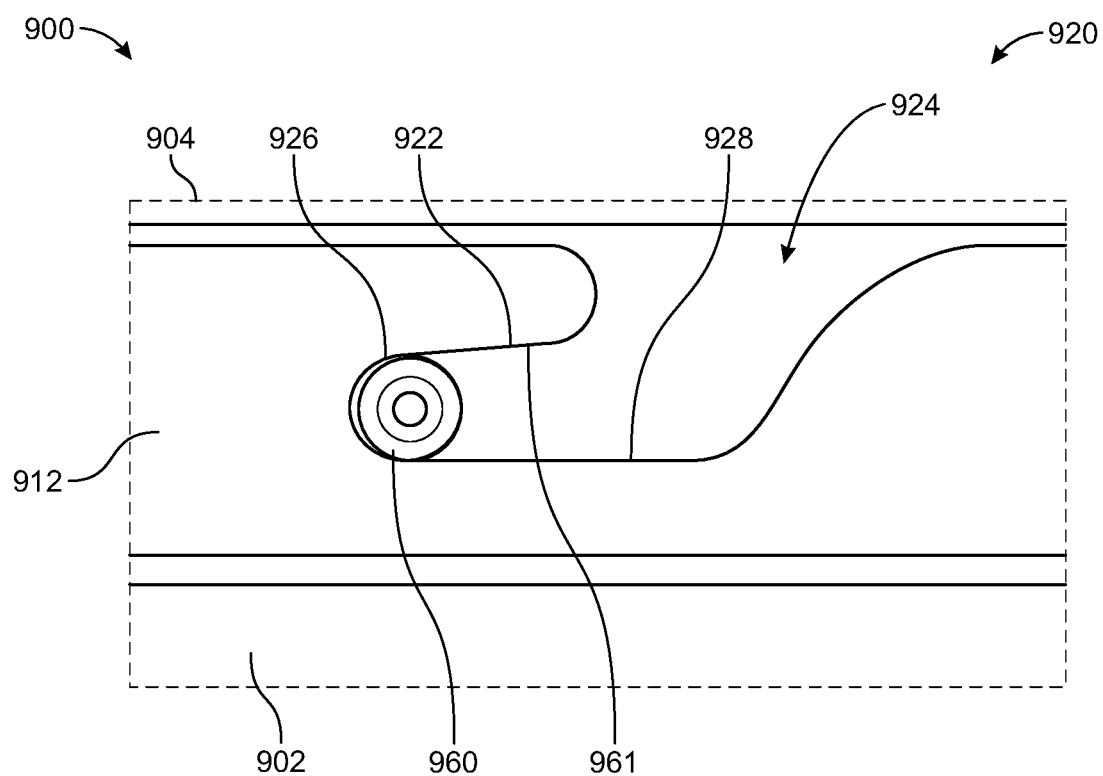
FIG. 9 is a side view of a portion of a computer chassis depicting a boss of a removable top cover within a receiving slot of a chassis base when the removable top cover is in a secured position, according to certain aspects of the present disclosure.

FIG. 9 is a side view of a portion of a computer chassis 900 depicting a boss 960 of a removable top cover 904 within a receiving slot 920 of a chassis base 902 when the removable top cover 904 is in a secured position, according to certain aspects of the present disclosure. Computer chassis 900 can be any suitable computer chassis, such as computer chassis 100 of FIG. 1. For illustrative purposes, the side view depicted in FIG. 9 is shown from within the computer chassis 900 looking towards an inner surface of sidewall 912 of the chassis base 902.

The receiving slot 920 is seen in the sidewall 912 of the chassis base 902. The receiving slot 920 includes a slot channel 922 that extends from a slot opening 924 to a slot distal end 926. When the top cover 904 is in the secured position, each boss 960 of the top cover 904 engages a respective receiving slot 920 and is moved towards the slot distal end 926. In some cases, the boss 960 can be positioned at the slot distal end 926, although in some cases the slot distal end 926 can extend past where the boss 960 is positioned when the top cover 904 is in the secured position (e.g., a multi-tiered slot channel can be used for different style top covers with different sized bosses, in which case a larger boss would not be able to move past a certain point within the slot channel even if the slot channel extends further).

In some cases, the receiving slot 920 can include a resting surface 928. The resting surface 928 can be parallel with a bottom surface of the chassis base 902, although that need not always be the case. In some cases, the resting surface 928 can be a surface of the slot channel 922 located immediately below the slot opening 924. The resting surface 928 can be a surface upon which the boss 960 rests when the top cover 904 is in the intermediate position. Movement of the top cover 904 from an intermediate position to the secured position can result in the boss 960 being moved towards the slot distal end 926 of the slot channel 922. In some cases, the slot channel 922 can include an inclined surface 961 that forces the top cover 904 towards the chassis base 902 as the boss 960 is moved towards the slot distal end 926.

Figure 10:
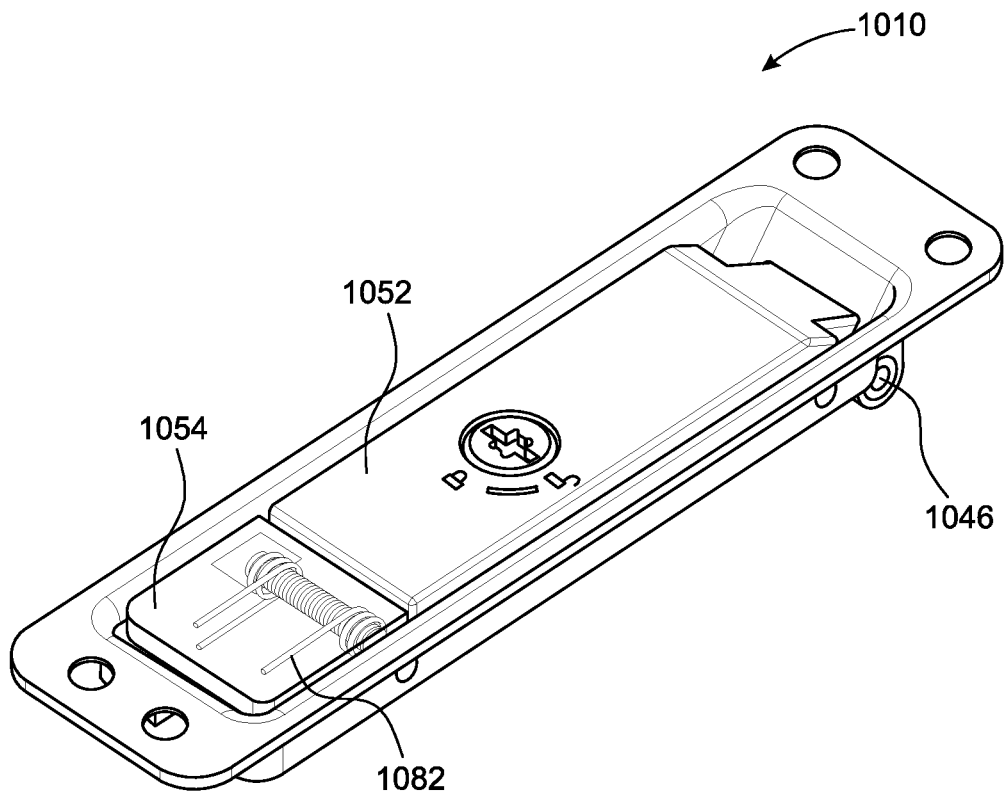
FIG. 10 is an axonometric projection of a latch assembly in a closed position, according to certain aspects of the present disclosure.

FIG. 10 is an axonometric projection of a latch assembly 1010 in a closed position, according to certain aspects of the present disclosure. Latch assembly 1010 can be any suitable latch assembly, such as latch assembly 610 of FIG. 6. For illustrative purposes, release tab 1054 is depicted as translucent to show biasing device 1082 (e.g., a spring). When the latch assembly 1010 is in the closed position, the lever 1052 and sliding body 1044 are in the closed position.

Figure 11:
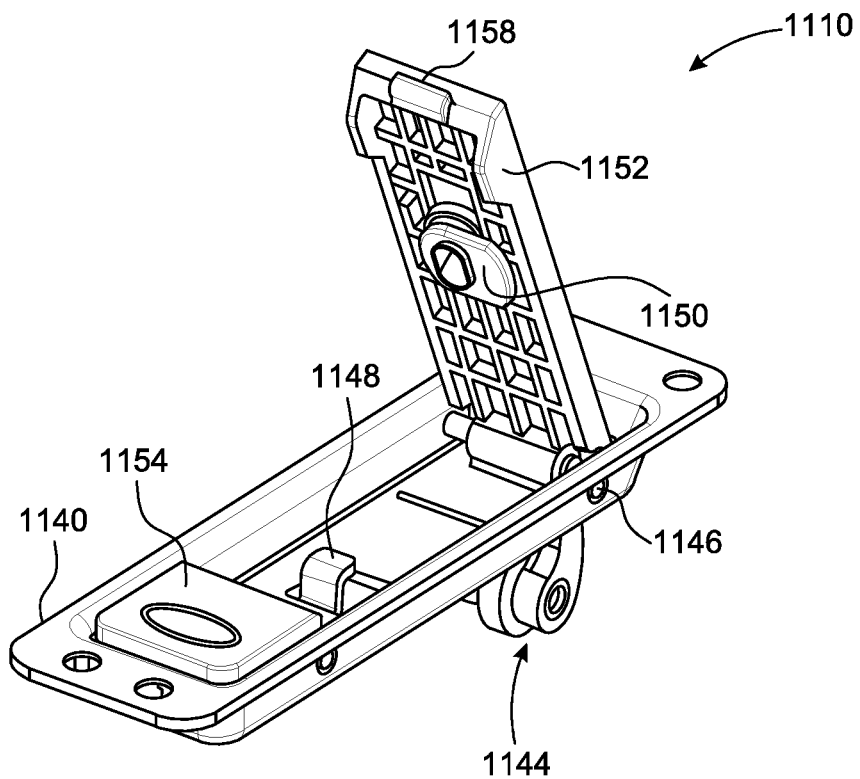
FIG. 11 is an axonometric projection of a latch assembly in an open position, according to certain aspects of the present disclosure.

FIG. 11 is an axonometric projection of a latch assembly 1110 in an open position, according to certain aspects of the present disclosure. Latch assembly 1110 can be any suitable latch assembly, such as latch assembly 610 of FIG. 6.

When the latch assembly 1110 is in the open position, the lever 1152 and sliding body 1144 are in the open position. In the open position, sliding body 1144 is rotated about the latch pivot 1146 so that it is spaced further apart from latch body 1140.

Lever 1152 includes a capture tab 1158 that is engageable with the release tab 1154 to retain the lever 1152 in a closed position while the release tab 1154 is not depressed. A lip of release tab 1154 can fit over the capture tab 1158 when the lever 1152 is in the closed position. When the release tab 1154 is depressed, the capture tab 1158 and lever 1152 can be permitted to move to the open position.

Lever 1152 can also include a locking body 1150 that can engage with lock receiver 1148 to lock the lever 1152 against the lever body 1140, regardless of the state of the release tab 1154 (e.g., depressed or not depressed). Locking body 1150 and lock receiver 1148 can take any suitable forms. As depicted in FIG. 11, locking body 1150 is a rotatable shaft with an elongated plate that, which engaged with the lever 1152 in a closed position, fits under lock receiver 1148 to keep the lever 1152 from moving out of the closed position. The lock receiver 1148 in this case is in the form of a shoulder spaced apart from a bottom surface of the latch body 1140.

Figure 12:
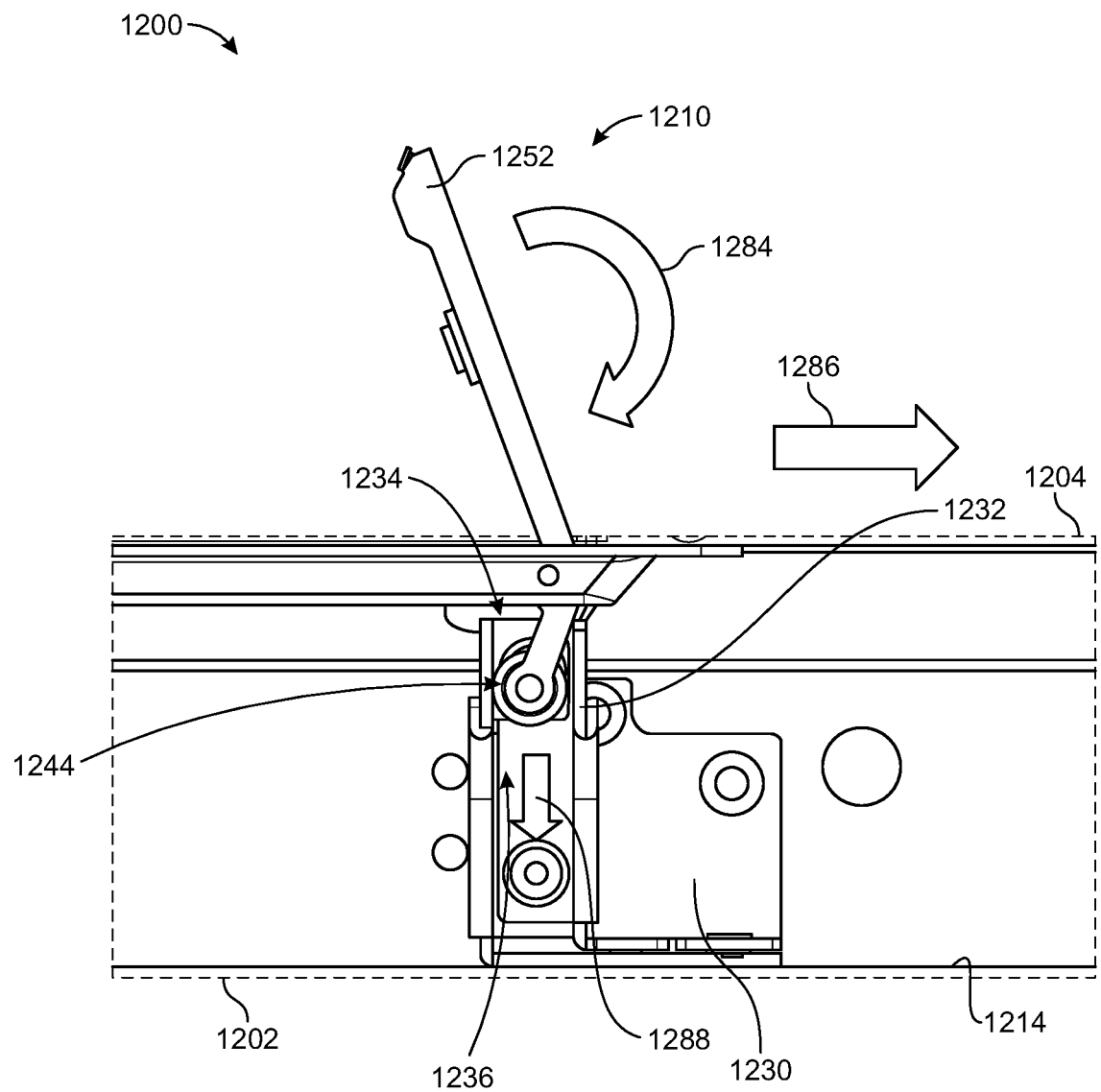
FIG. 12 is a side view of a portion of a computer chassis depicting latch assembly in an open position engaging a latch receiver, according to certain aspects of the present disclosure.

FIG. 12 is a side view of a portion of a computer chassis 1200 depicting a latch assembly 1210 in an open position engaging a latch receiver 1230, according to certain aspects of the present disclosure. Computer chassis 1200 can be any suitable computer chassis, such as computer chassis 100 of FIG. 1. Computer chassis 1200 can be computer chassis 800 of FIG. 8 with the latch assembly 1210 moved from a closed position to an open position.

The latch receiver 1230 is mounted to a bottom surface 1214 of the chassis base 1202. The latch receiver 1230 includes a receiver channel 1232 that accepts a sliding body 1244 of a latch assembly 1210. The receiver channel 1232 has a receiver opening 1234 that faces away from the bottom surface 1214 of the chassis base 1202 (e.g., faces upwards as seen in FIG. 12). The sliding body 1244 can enter the receiver channel 1232 through the receiver opening 1234. The receiver channel 1232 also includes a receiver distal end 1236 opposite the receiver opening 1234. The receiver distal end 1236 can be a portion of the receiver channel 1232 facing the bottom surface 1214 of the chassis base 1202. The receiver channel 1232 can have a receiver distal end 1236 that is open (e.g., as a drinking straw) or closed (e.g., as a bottom of a test tube).

The latch assembly 1210 is seen mounted (e.g., flush mounted) to the top cover 1204. The top cover 1204 is in the intermediate position with respect to the chassis base 1202. In the intermediate position, the sliding body 1244 of the latch assembly 1210 is located within the receiver channel 1232 of the latch receiver 1230. More specifically, when the top cover 1204 is in the intermediate position, the sliding body 1244 is located in the receiver channel 1232 at a position further from the receiver opening 1234 than when the top cover 1204 is in a secured position.

Since the latch receiver 1230 is fixed to the chassis base 1202, movement of the lever 1252 of the latch assembly 1210 from a closed position to an open position, as depicted by arrow 1284, causes the sliding body 1244 to move in a downwards direction 1288 while the top cover 1204 moves in a rearward direction 1286. The use of a lever 1252 to move the sliding body 1244 to the open position provides a mechanical advantage to disengage any elements of the top cover 1204 and chassis base 1202 that may be engaged together (e.g., tongue and groove or tongue and lip engagements).

Figure 13:
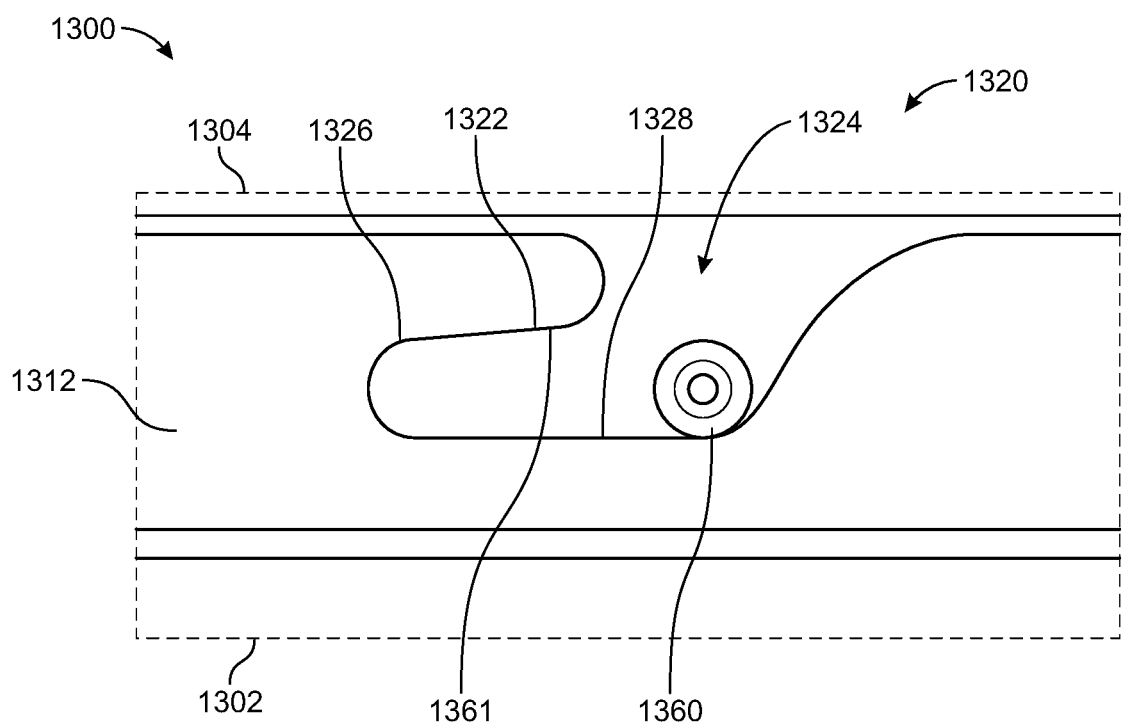
FIG. 13 is a side view of a portion of a computer chassis depicting a boss of a removable top cover within a receiving slot of a chassis base when the removable top cover is in an intermediate position, according to certain aspects of the present disclosure.

FIG. 13 is a side view of a portion of a computer chassis 1300 depicting a boss 1360 of a removable top cover 1304 within a receiving slot 1320 of a chassis base 1302 when the removable top cover 1304 is in an intermediate position, according to certain aspects of the present disclosure. Computer chassis 1300 can be any suitable computer chassis, such as computer chassis 100 of FIG. 1. For illustrative purposes, the side view depicted in FIG. 13 is shown from within the computer chassis 1300 looking towards an inner surface of sidewall 1312 of the chassis base 1302. Computer chassis 1300 can be computer chassis 900 of FIG. 9 with the top cover 1304 moved to the intermediate position.

The receiving slot 1320 is seen in the sidewall 1312 of the chassis base 1302. The receiving slot 1320 includes a slot channel 1322 that extends from a slot opening 1324 to a slot distal end 1326. When the top cover 1304 is in the intermediate position, each boss 1360 of the top cover 1304 engages a respective receiving slot 1320 and can be spaced apart from the slot distal end 1326.

In some cases, when the top cover 1304 is in the intermediate position, boss 1360 can be resting on a resting surface 1328 of the receiving slot 1320. The resting surface 1328 can be parallel with a bottom surface of the chassis base 1302, although that need not always be the case. In some cases, the resting surface 1328 can be a surface of the slot channel 1322 located immediately below the slot opening 1324. Movement of the top cover 1304 from an intermediate position to the secured position can result in the boss 1360 being moved towards the slot distal end 1326 of the slot channel 1322. In some cases, the slot channel 1322 can include an inclined surface 1361 that forces the top cover 1304 towards the chassis base 1302 as the boss 1360 is moved towards the slot distal end 1326.

When in the intermediate position, the top cover 1304 can be easily lifted away from the chassis base 1302, resulting in boss 1360 exiting the receiving slot 1320. Similarly, when in an uncoupled (e.g., separated) position, the top cover 1304 can be easily moved to the intermediate position by placing the top cover 1304 over the chassis base 1302 such that boss 1360 enters the receiving slot 1320 via the receiving opening 1324. When in the intermediate position, the top cover 1304 can be moved to the secured position by forcing the boss 1360 towards the distal end 1326 of the slot channel 1322.

Figure 14:
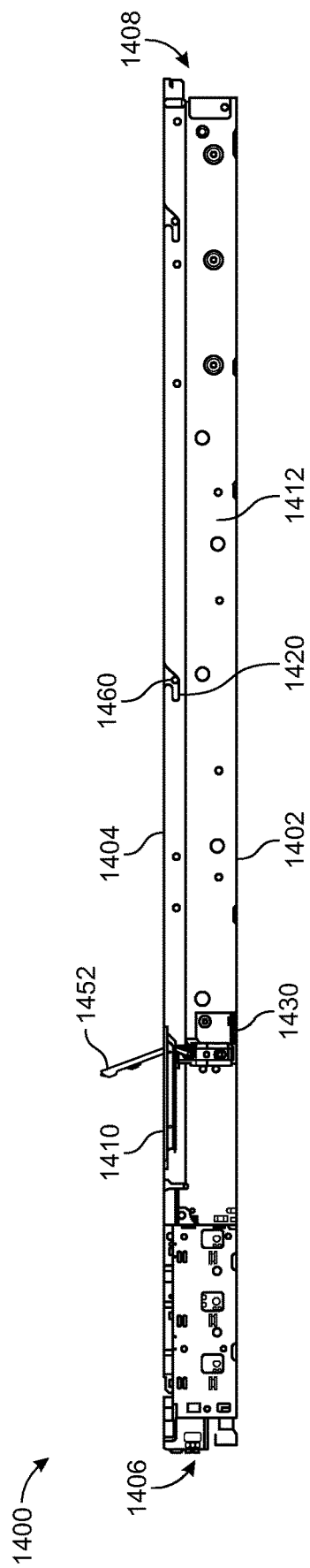
FIG. 14 is a side view of a computer chassis depicting a removable top cover in an intermediate position with respect to a chassis base, according to certain aspects of the present disclosure.

FIG. 14 is a side view of a computer chassis 1400 depicting a removable top cover 1404 in an intermediate position with respect to a chassis base 1402, according to certain aspects of the present disclosure. Computer chassis 1400 can be any suitable computer chassis, such as computer chassis 100 of FIG. 1. For illustrative purposes, the nearest sidewalls of the computer chassis 1400 are not depicted, permitting view of the latch receiver 1430 within the computer chassis 1400 and the inner surface of the far sidewall 1412. Computer chassis 1400 can be with the latch assembly 1410 moved to the open position to move the top cover 1404 into an intermediate position.

Computer chassis 1400 can include a top cover 1404 resting on chassis base 1402. Top cover 1404 can be in an intermediate position. In the intermediate position, bosses 1460 of the top cover 1404 are loosely engaging and resting within receiving slots 1420 of the chassis base 1402, but not forced towards distal ends of the receiving slots 1420. The latch assembly 1410 of the top cover 1404 is engaged with the latch receiver 1430 of the chassis base 1402. The latch assembly 1410 is in an open position (e.g., with lever 1452 in an open position).

In the intermediate position, the top cover 1404 is not fully translated towards the front end 1406 of the chassis base 1402, and is instead translated towards the rear end 1408 of the chassis base 1402 (at least with respect to the secured position). To move the top cover 1404 from the intermediate position to the secured position, the latch assembly 1410 can be moved to a closed position, thus translating the top cover 1404 towards the front end 1406 of the chassis base 1402. To move the top cover 1404 to an uncoupled position, the top cover 1404 can be lifted away from the chassis base 1402.

Figure 15:
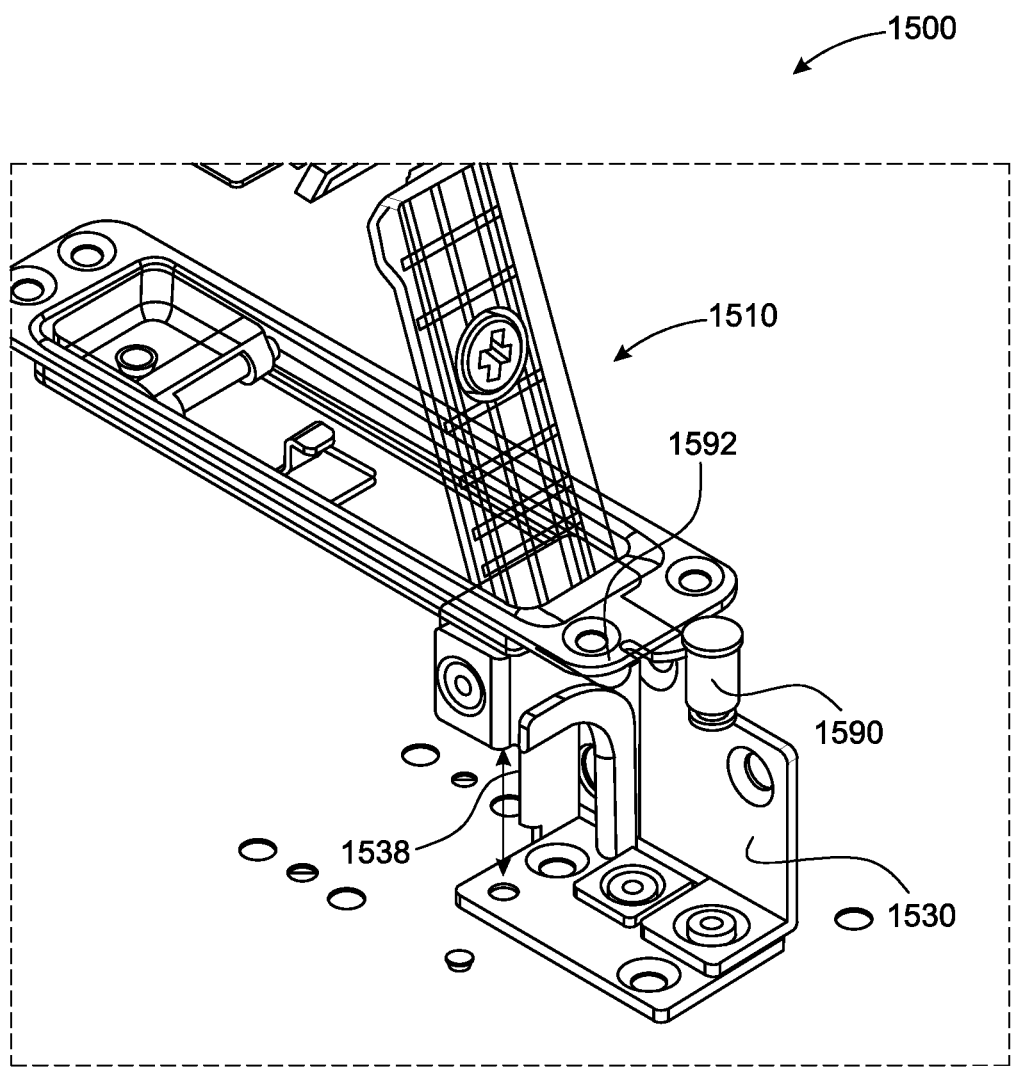
FIG. 15 is an axonometric projection of a portion of a computer chassis depicting a latch assembly in an open position engaging a latch receiver having a slot for receiving a supplemental securement feature of a removable top cover, according to certain aspects of the present disclosure.

FIG. 15 is an axonometric projection of a portion of a computer chassis 1500 depicting a latch assembly 1510 in an open position engaging a latch receiver 1530 having a slot 1592 for receiving a supplemental securement feature 1590 of a removable top cover, according to certain aspects of the present disclosure. Computer chassis 1500 can be any suitable computer chassis, such as computer chassis 100 of FIG. 1.

Latch assembly 1510 can engage the latch receiver 1530. Since the latch assembly 1510 is in an open position, the top cover is in the intermediate position and can be translated with respect to the chassis base to be moved to the secured position.

In computer chassis 1500, the top cover includes a supplemental securement feature 1590 in the form of a shaft with a shoulder (e.g., a shaft having a smaller diameter portion located between a larger diameter portion and the top cover). The supplemental securement feature 1590 can be sized to engage slot 1592 when the top cover is moved towards the secured position (e.g., the latch assembly 1510 is moved towards the closed position). When engaged with slot 1592, the supplemental securement feature 1590 can help secure the top cover to the chassis base. The use of such a supplemental securement feature 1590 can also provide additional structural support to the top cover. This approach to providing structural support to the top cover can also free up space within the chassis base for other computer components and/or airflow, such as space that would otherwise be used to provide structural support.

Slot 1592 can be coupled to the chassis base in any suitable fashion. However, in some cases, it has been found to be beneficial to include a slot 1592 that is coupled to and/or otherwise a part of latch receiver 1530. Therefore, when the latch assembly 1510 is moved towards the closed position, the supplemental engagement feature 1590 can engage slot 1592 of the latch receiver 1530 to help provide structural support at a region adjacent the latch receiver 1530.

Additionally, in some cases, latch receiver 1530 can include a pass-through 1538. Pass-through 1538 can take the form of a non-enclosed opening (as depicted) or an enclosed opening. Pass-through 1538 can be an open space that permits cables or other objects to pass across the latch receiver 1530 in a forward or rearward direction.

Figure 16:
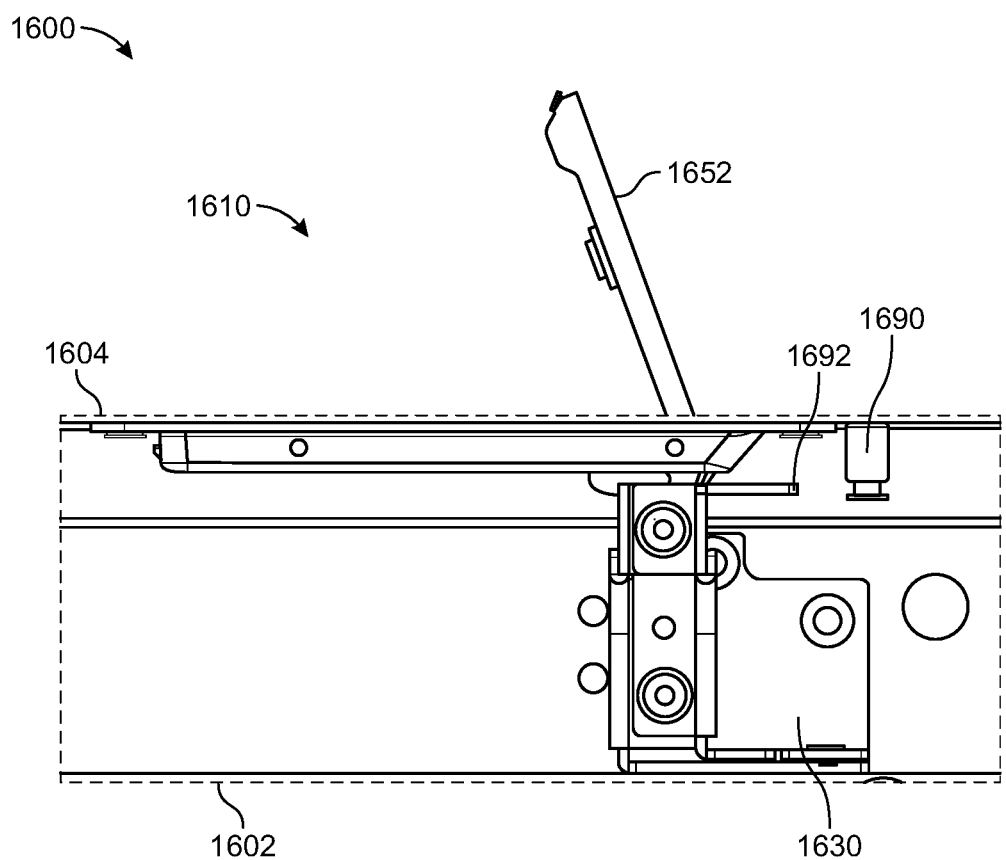
FIG. 16 is a side view of a portion of a computer chassis depicting a latch assembly in an open position engaging a latch receiver having a slot for receiving a supplemental securement feature of a removable top cover, according to certain aspects of the present disclosure.

FIG. 16 is a side view of a portion of a computer chassis 1600 depicting a latch assembly 1610 in an open position engaging a latch receiver 1630 having a slot 1692 for receiving a supplemental securement feature 1690 of a removable top cover 1604, according to certain aspects of the present disclosure. Computer chassis 1600 can be any suitable computer chassis, such as computer chassis 100 of FIG. 1. Latch receiver 1630 can be latch receiver 1530 of FIG. 15.

Top cover 1604 can include a supplemental engagement feature 1690 extending (e.g., downwards) from the underside of the top cover 1604. The supplemental securement feature 1690 can be in the form of a shaft with a shoulder (e.g., a shaft having a smaller diameter portion located between a larger diameter portion and the top cover 1604). The supplemental securement feature 1690 can be sized to engage slot 1692 when the top cover 1604 is moved towards the secured position (e.g., the latch assembly 1610 is moved towards the closed position). When engaged with slot 1692, the supplemental securement feature 1690 can help secure the top cover 1604 to the chassis base 1602. The use of such a supplemental securement feature 1690 can also provide additional structural support to the top cover 1604. This approach to providing structural support to the top cover 1604 can also free up space within the chassis base 1602 for other computer components and/or airflow, such as space that would otherwise be used to provide structural support.

Slot 1692 can be coupled to the chassis base 1602 in any suitable fashion. However, in some cases, it has been found beneficial to include a slot 1692 that is coupled to and/or otherwise a part of latch receiver 1630. Therefore, when the latch assembly 1610 is moved towards the closed position (e.g., moving lever 1652 to the closed position), the supplemental engagement feature 1690 can engage slot 1692 of the latch receiver 1630 to help provide structural support at a region adjacent the latch receiver 1630.

Figure 17:
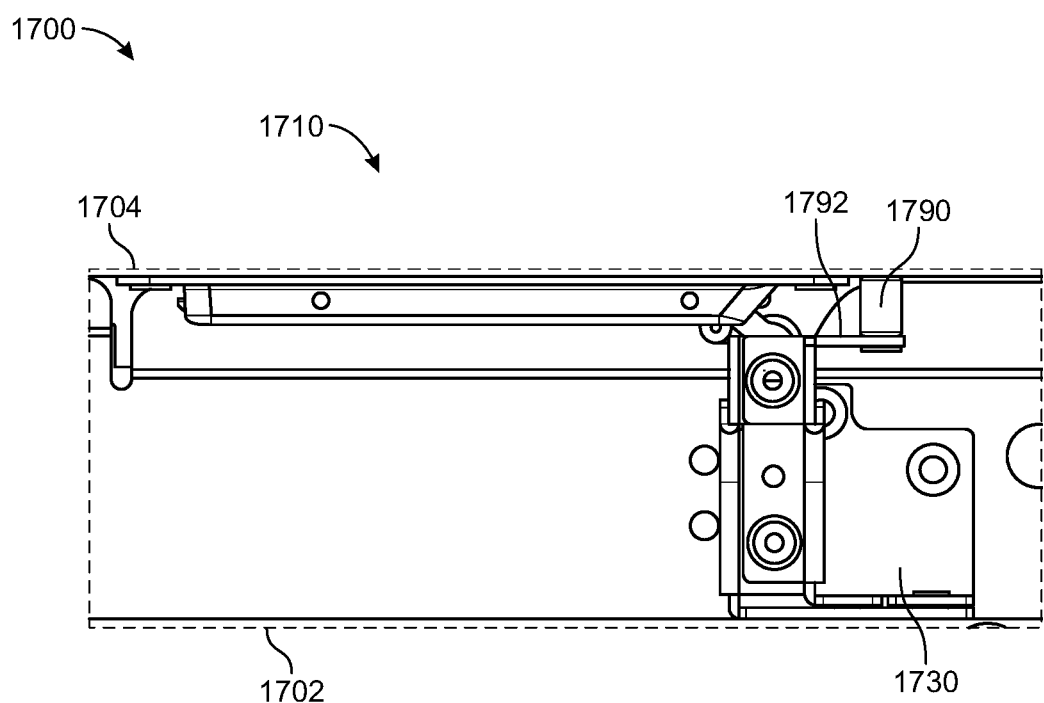
FIG. 17 is a side view of a portion of the computer chassis depicting a latch assembly in a closed position engaging a latch receiver having a slot for receiving a supplemental securement feature of a removable top cover, according to certain aspects of the present disclosure.

FIG. 17 is a side view of a portion of the computer chassis 1700 depicting a latch assembly 1710 in a closed position engaging a latch receiver 1730 having a slot 1792 for receiving a supplemental securement feature 1790 of a removable top cover 1704, according to certain aspects of the present disclosure. Computer chassis 1700 can be any suitable computer chassis, such as computer chassis 100 of FIG. 1. Computer chassis 1700 can be computer chassis 1600 with the top cover 1704 moved to the secured position.

Top cover 1704 can include a supplemental engagement feature 1790 extending (e.g., downwards) from the underside of the top cover 1704. The supplemental securement feature 1790 can be in the form of a shaft with a shoulder (e.g., a shaft having a smaller diameter portion located between a larger diameter portion and the top cover 1704). The supplemental securement feature 1790 can engage slot 1792 when the top cover 1704 is in the secured position (e.g., latch assembly 1710 in the closed position). Slot 1792 can be coupled to the chassis base 1702, such as via latch receiver 1730.

Figure 18:
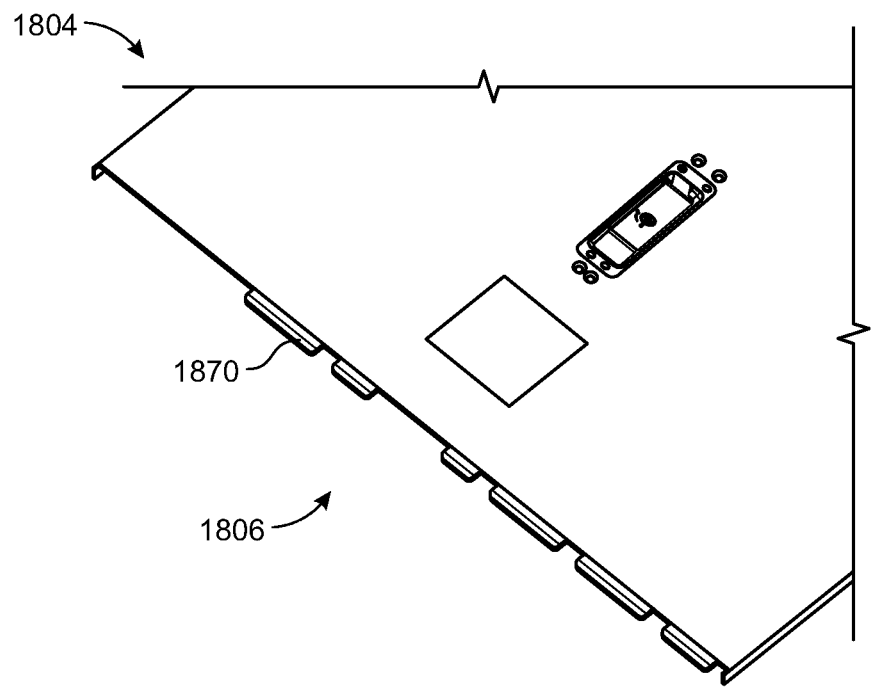
FIG. 18 is an axonometric projection of a front end of a removable top cover, according to certain aspects of the present disclosure.

FIG. 18 is an axonometric projection of a front end 1806 of a removable top cover 1804, according to certain aspects of the present disclosure. Top cover 1804 can be any suitable top cover, such as top cover 104 of FIG. 1. Top cover 1804 can include one or more tongues 1870. Tongues 1870 can extend from an end of the top cover 1804, such as from a front end 1806 of the top cover 1804. Tongues 1870 can fit within corresponding grooves or under corresponding lips of a chassis base when the top cover 1804 is moved from an intermediate position to a secured position.

Figure 19:
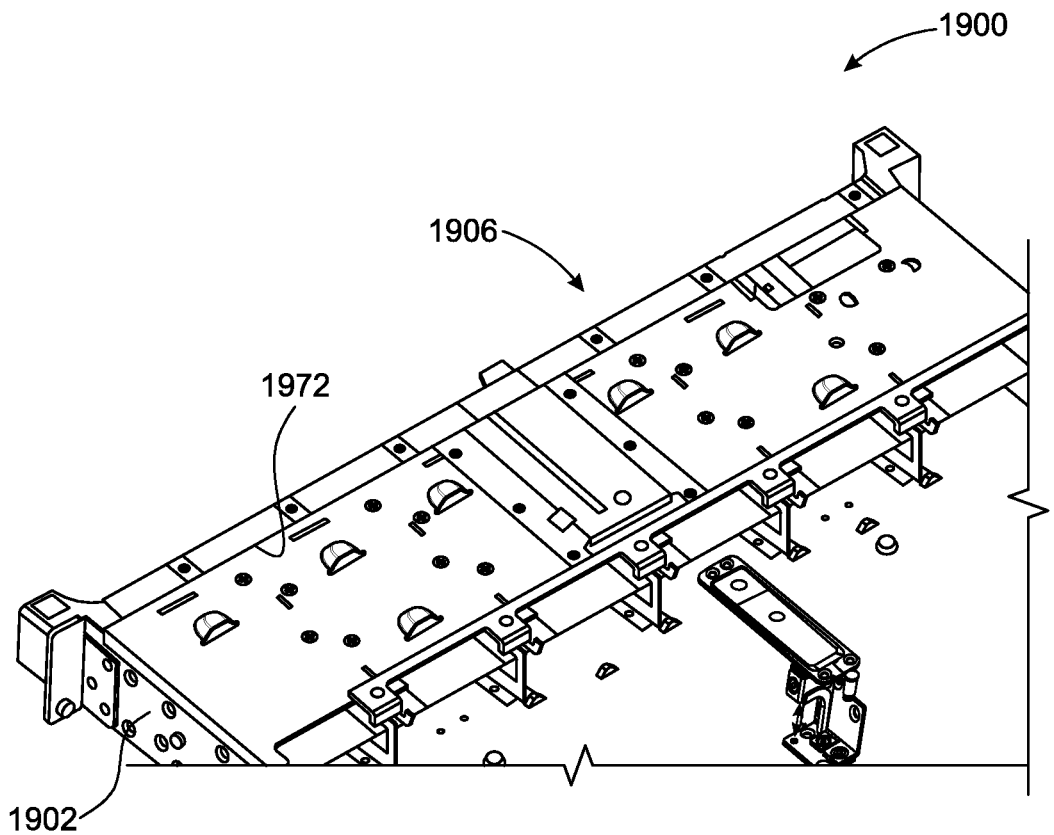
FIG. 19 is an axonometric projection of a portion of a computer chassis depicting a front end of a chassis base, according to certain aspects of the present disclosure.

FIG. 19 is an axonometric projection of a portion of a computer chassis 1900 depicting a front end 1906 of a chassis base 1902, according to certain aspects of the present disclosure. Chassis base 1902 can be any suitable chassis base, such as chassis base 102 of FIG. 1. For illustrative purposes, the top cover is depicted as translucent. Chassis base 1902 can include one or more lips 1972 for receiving one or more tongues of a top cover (e.g., tongues 1870 of FIG. 18). Lip 1972 can extend over tongues of the top cover and optionally an additional portion of the top cover.

Figure 20:
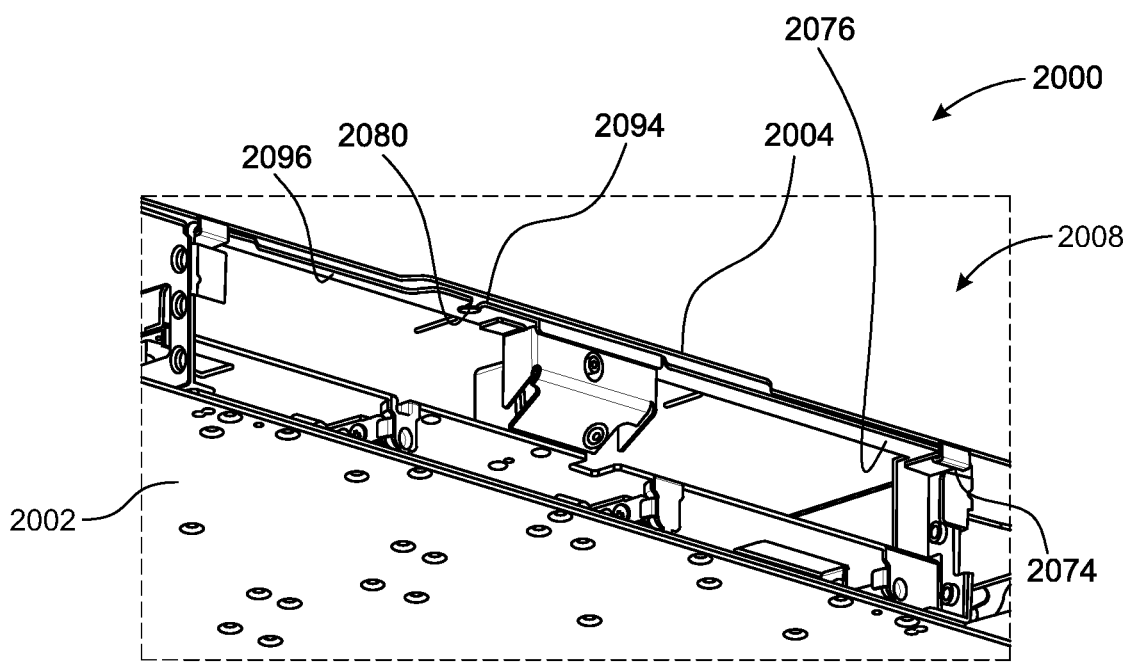
FIG. 20 is an axonometric projection of a portion of a computer chassis depicting a top cover engaging a rear end of a chassis base, according to certain aspects of the present disclosure.

FIG. 20 is an axonometric projection of a portion of a computer chassis 2000 depicting a top cover 2004 engaging a rear end 2008 of a chassis base 2002, according to certain aspects of the present disclosure. Computer chassis 2000 can be any suitable computer chassis, such as computer chassis 100 of FIG. 1.

Top cover 2004 can include one or more rear tabs 2074. A rear tab 2074 can include a portion of material (e.g., metal used to form the top cover 2004) that is bent to extend towards a front end of the top cover 2004. Thus, a rear tab 2074 can engage a corresponding lip 2076 of the chassis base 2002 when the top cover 2004 is moved from an intermediate position to a secured position. The use of rear tabs 2074 can facilitate securing the top cover 2004 to the chassis base.

In some cases, top cover 2004 can include a supplemental securement feature 2080 extending from an underside of the top cover 2004. The supplemental securement feature 2080 can engage a corresponding supplemental receiving slot 2094 fixed with respect to the chassis base 2002.

In some cases, the supplemental receiving slot 2094 and/or lip 2076 can be incorporated into a rear frame piece 2096 coupled to the chassis base 2002.

Figure 21:
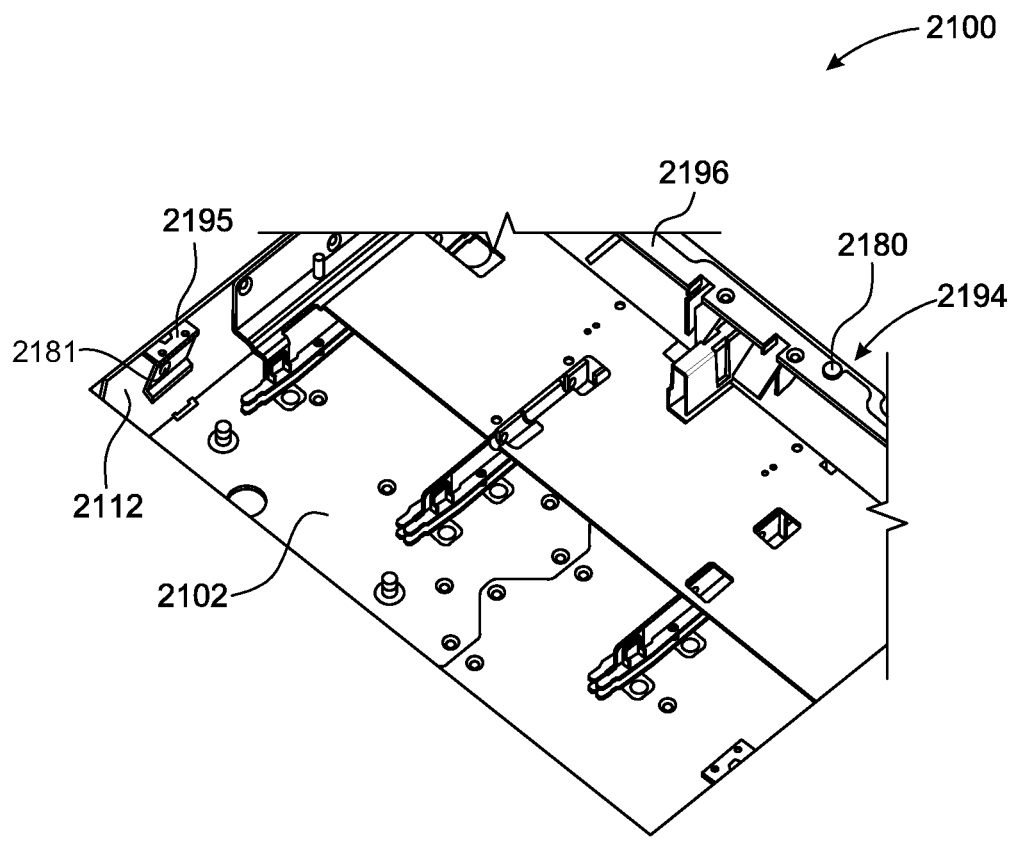
FIG. 21 is an axonometric projection of a portion of a computer chassis depicting a chassis base with supplemental securement features, according to certain aspects of the present disclosure.

FIG. 21 is an axonometric projection of a portion of a computer chassis 2100 depicting a chassis base 2102 with supplemental securement features 2181, according to certain aspects of the present disclosure. Computer chassis 2100 can be any suitable computer chassis, such as computer chassis 100 of FIG. 1. For illustrative purposes, the top cover of the computer chassis 2100 is depicted as translucent.

The chassis base 2102 can include a rear frame piece 2196. The rear frame piece 2196 can include a supplemental receiving slot 2194 for receiving a supplemental securement feature 2180 of the top cover. The supplemental securement feature 2180 engages the supplemental receiving slot 2194 when the top cover is in the secured position.

In some cases, chassis base 2102 can include one or more supplemental securement features 2181 extending from one or more sidewalls 2112 of the chassis base 2102. Supplemental securement feature 2181 can extend in an inward direction (e.g., from an inner surface of sidewall 2112 towards a centerline of the chassis base 2102). The supplemental securement feature 2181 can engage a bracket 2195 coupled to the top cover when the top cover is moved from an intermediate position to a secured position.

Figure 22:
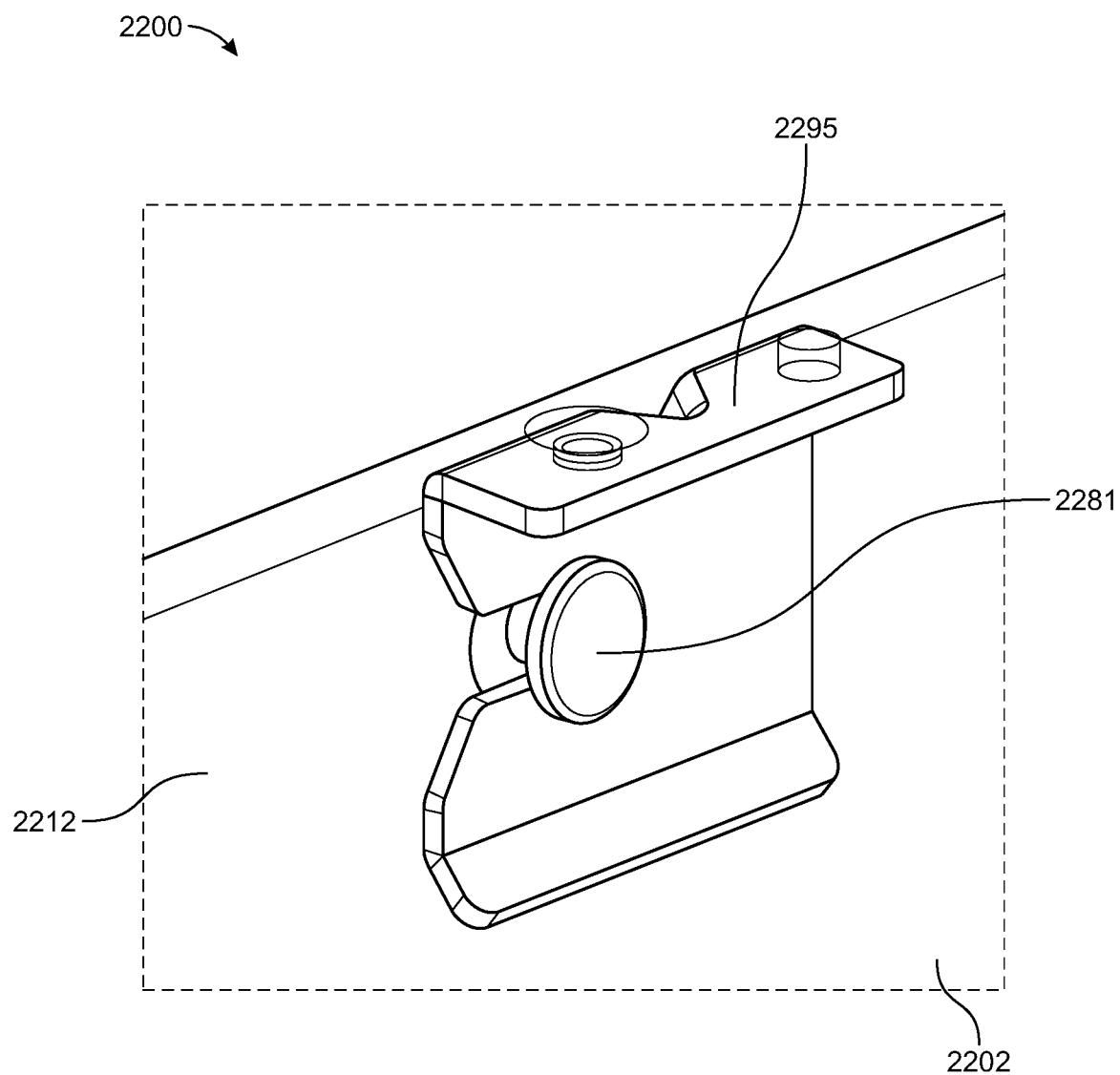
FIG. 22 is an enlarged axonometric projection of a portion of a computer chassis depicting a supplemental securement feature, according to certain aspects of the present disclosure.

FIG. 22 is an enlarged axonometric projection of a portion of a computer chassis 2200 depicting a supplemental securement feature 2281, according to certain aspects of the present disclosure. Computer chassis 2200 can be any suitable computer chassis, such as computer chassis 100 of FIG. 1. For illustrative purposes, the top cover of the computer chassis 2200 is not depicted, although the bracket 2295 coupled to the top cover is shown.

Chassis base 2202 can include one or more supplemental securement features 2281 extending from one or more sidewalls 2212 of the chassis base 2202. Supplemental securement feature 2281 can extend in an inward direction (e.g., from an inner surface of sidewall 2212 towards a centerline of the chassis base 2202. The supplemental securement feature 2281 can engage a bracket 2295 coupled to the top cover when the top cover is moved from an intermediate position to a secured position. Engagement of the supplemental securement feature 2281 with the bracket 2295 can help secure the top cover to the chassis base 2202 and/or provide additional structural support to the top cover.

Figure 23:
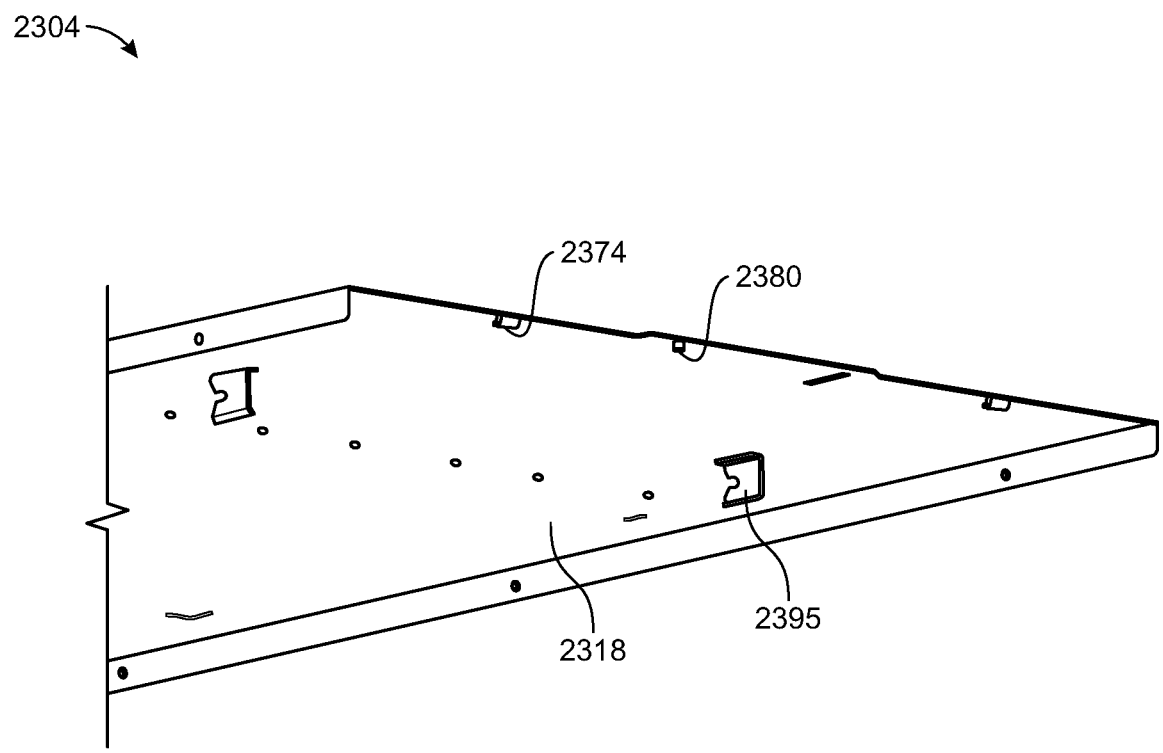
FIG. 23 is an axonometric projection of an underside of a removable top cover with supplemental securement features, according to certain aspects of the present disclosure.

FIG. 23 is an axonometric projection of an underside of a removable top cover 2304 with supplemental securement features 2380, according to certain aspects of the present disclosure. Top cover 2304 can be any suitable top cover, such as top cover 104 of FIG. 1.

The top cover 2304 can include one or more supplemental securement features 2380. The top cover 2304 can include one or more rear tabs 2374. In some cases, the top cover 2304 can include one or more brackets 2395 coupled to and/or extending from an underside 2318 of the top cover 2304. The one or more brackets 2394 can be positioned to engage supplemental securement features of a chassis base.

Figure 24:
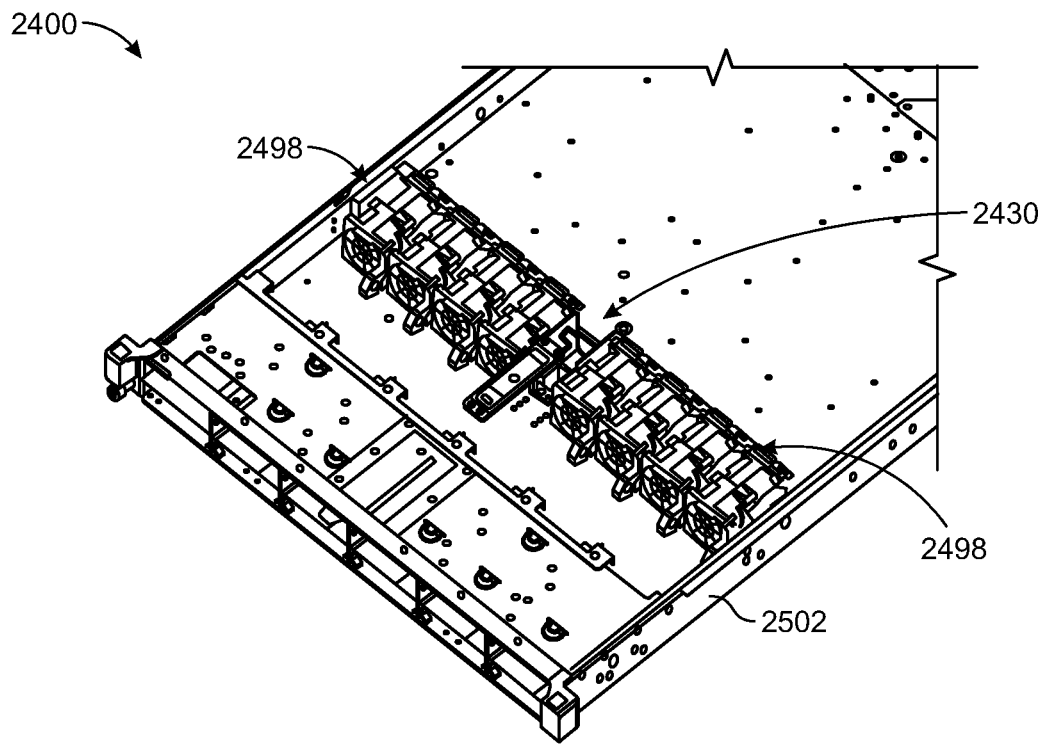
FIG. 24 is an axonometric projection of a computer chassis having electronic components adjacent the latch receiver, according to certain aspects of the present disclosure.

FIG. 24 is an axonometric projection of a computer chassis 2400 having electronic components 2498 adjacent the latch receiver 2430, according to certain aspects of the present disclosure. Computer chassis 2400 can be any suitable computer chassis, such as computer chassis 100 of FIG. 1. For illustrative purposes, the top cover of computer chassis 2400 is depicted as translucent.

Latch receiver 2430 is coupled to a bottom surface of the chassis base 2502. In some cases, computer components 2498 (e.g., computer fans) can be positioned in the chassis base 2502 across the width of the chassis base 2502 in-line with the latch receiver 2430. The latch receiver 2430 can include a pass-through to permit cables to pass from one side of the computer components 2498 (e.g., a front side) to an opposite side of the computer components 2498 (e.g., a rear side).

Figure 25:
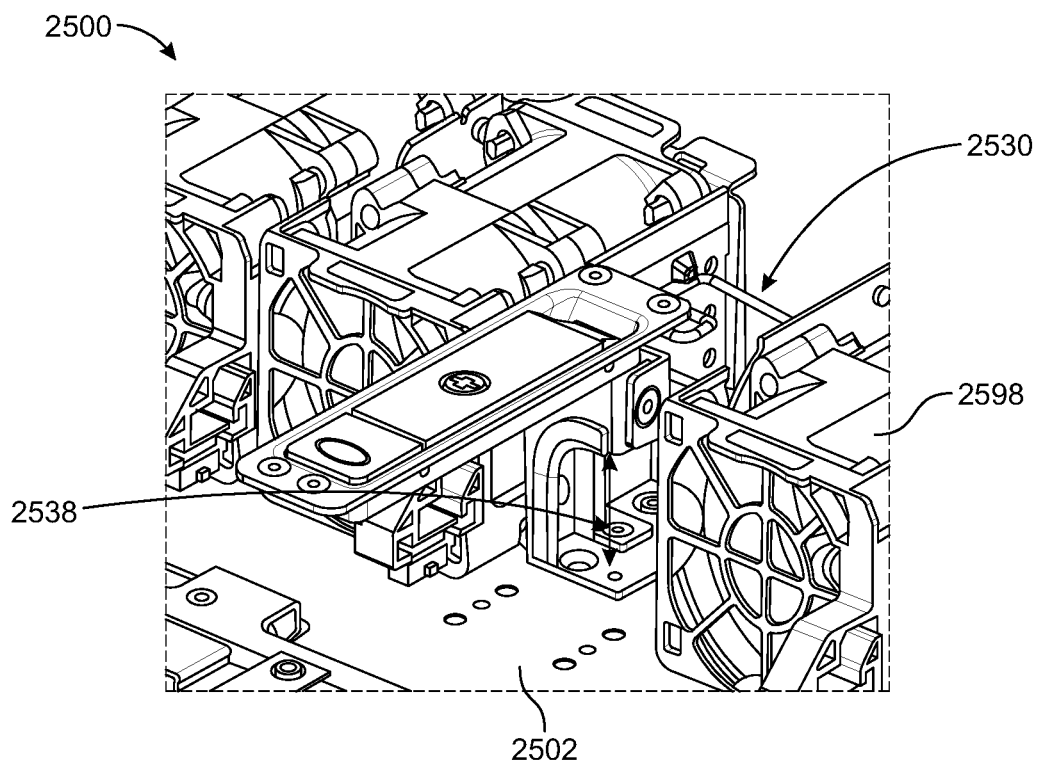
FIG. 25 is an enlarged axonometric projection of a portion of a computer chassis depicting a latch receiver with nearby electronic components, according to certain aspects of the present disclosure.

FIG. 25 is an enlarged axonometric projection of a portion of a computer chassis 2500 depicting a latch receiver 2530 with nearby electronic components 2598, according to certain aspects of the present disclosure. Computer chassis 2500 can be any suitable computer chassis, such as computer chassis 100 of FIG. 1. For illustrative purposes, the top cover of computer chassis 2500 is depicted as translucent.

Latch receiver 2530 is coupled to a bottom surface of the chassis base 2502. In some cases, computer components 2598 (e.g., computer fans) can be positioned in the chassis base 2502 across the width of the chassis base 2502 in-line with the latch receiver 2530. The latch receiver 2530 can include a pass-through 2538 to permit cables to pass from one side of the computer components 2598 (e.g., a front side) to an opposite side of the computer components 2598 (e.g., a rear side).

Figure 26:
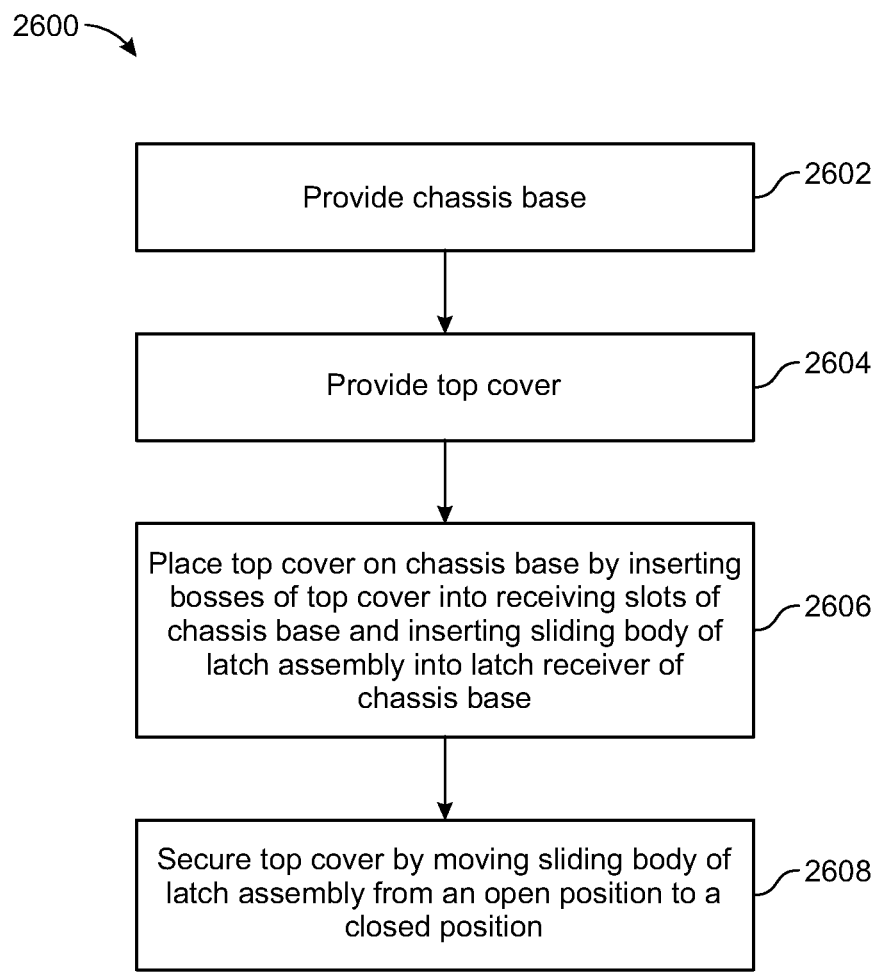
FIG. 26 is a flowchart depicting a process for assembling a computer chassis, according to certain aspects of the present disclosure.

FIG. 26 is a flowchart depicting a process 2600 for assembling a computer chassis, according to certain aspects of the present disclosure. Process 2600 can be used to assembly any suitable computer chassis disclosed herein, such as computer chassis 100 of FIG. 1.

At block 2602, a chassis base can be provided. The chassis base can include a bottom surface and a set of sidewalls. The chassis base can include a latch receiver coupled to the bottom surface. The latch receiver can include a latch receiver channel extending from a latch receiver opening to a latch receiver channel distal end. The chassis base can also include receiving slots at upper edges of the set of sidewalls. Each receiving slot can include a slot channel extending from a slot opening to a slot distal end.

At block 2604, a top cover can be provided. The top cover can include a latch assembly having a sliding body rotatable about a latch pivot between an open position and a closed position. The top cover can also include a set of bosses corresponding to respective receiving slots of the chassis base.

At block 2606, the top cover can be placed on the chassis base by inserting the bosses of the top cover into the receiving slots of the chassis base. Placing the top cover on the chassis base at block 2606 can also include inserting a sliding body of the latch assembly of the top cover into the receiving channel of the latch receiver of the chassis base. Placing the top cover on the chassis base results in the top cover being in an intermediate position.

At block 2608, the top cover can be secured by moving the sliding body of the latch assembly from an open position to a closed position. Moving the sliding body from the open position to the closed position can include moving a lever of the latch assembly from an open position to a closed position. Moving the sliding body from the open position to the closed position can cause the top cover to move from the intermediate position to a secured position. Moving the top cover from the intermediate position to the secured position can include moving the bosses of the top cover towards distal ends of the receiving slots.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the invention. Thus, the breadth and scope of the present invention should not be limited by any of the above described embodiments.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computer chassis, comprising:
a chassis base for receiving a motherboard, the chassis base having a bottom surface and a set of sidewalls, the chassis base further comprising receiving slots at upper edges of the set of sidewalls, wherein each of the receiving slots comprises a slot channel extending from a slot opening to a slot distal end;
a top cover removably couplable to the chassis base, the top cover comprising a set of bosses, wherein each boss of the set of bosses corresponds to a respective receiving slot of the chassis base, the top cover further comprising a latch assembly having a sliding body rotatable about a latch pivot between an open position and a closed position; and
a latch receiver coupled to the bottom surface of the chassis base, the latch receiver having a latch receiver channel extending from a latch receiver opening to a latch receiver channel distal end, wherein the latch receiver comprises an opening for passing cables from a front end of the latch receiver to a rear end of the latch receiver, the opening positioned between the bottom surface of the chassis base and the latch receiver channel distal end;
wherein the top cover is moveable through an intermediate position between an uncoupled position and a secured position;
wherein, when the top cover is in the uncoupled position, the top cover is not coupled to the chassis base;
wherein, when the top cover is in the intermediate position, i) the sliding body is received by the latch receiver, ii) each boss of the set of bosses is received by the slot opening of the respective receiving slot of the chassis base, and iii) the sliding body is in the open position; and
wherein, when the top cover is in the secured position, i) the sliding body is in a closed position, and ii) each boss of the set of bosses is located at the slot distal end of the respective receiving slot of the chassis base.

2. The computer chassis of claim 1, wherein each receiving slot of the receiving slots comprises a resting surface parallel to the bottom surface of the chassis base, wherein each boss of the set of bosses of the top cover rests upon the resting surface of the respective receiving slot of the chassis base when the top cover is in the intermediate position.

3. The computer chassis of claim 1, wherein each receiving slot of the receiving slots is shaped such that movement of the top cover from the intermediate position to the secured position moves the top cover towards a front end of the chassis base.

4. The computer chassis of claim 1, wherein the receiving slots comprise a first set of receiving slots on a first sidewall of the set of sidewalls and a second set of receiving slots on a second sidewall of the set of sidewalls, wherein locations of the first set of receiving slots along the first sidewall are aligned with locations of the second set of receiving slots along the second sidewall.

5. The computer chassis of claim 1, wherein the latch receiver further comprises a receiving slot, wherein the top cover further comprises a securement feature extending from an underside of the top cover, and wherein the securement feature engages the receiving slot of the latch receiver when the top cover is in the secured position.

6. The computer chassis of claim 5, wherein the receiving slot of the latch receiver is oriented parallel to the bottom surface of the chassis base.

7. The computer chassis of claim 1, wherein the chassis base further comprises a supplemental receiving slot, wherein the top cover further comprises a securement feature extending from an underside of the top cover, and wherein the securement feature engages the supplemental receiving slot of the chassis base when the top cover is in the secured position.

8. The computer chassis of claim 7, wherein the supplemental receiving slot is positioned on a bracket extending from a first sidewall of the set of sidewalls to a second sidewall of the set of sidewalls.

9. The computer chassis of claim 1, wherein the top cover further comprises a bracket extending from an underside of the top cover, the bracket comprising a receiving slot, wherein the chassis base further comprises a securement feature extending from a sidewall of the set of sidewalls, and wherein the securement feature of the chassis base engages the receiving slot of the top cover when the top cover is in the secured position.

10. The computer chassis of claim 1, wherein the latch assembly further comprises:
a latch body supporting the sliding body about the latch pivot, the latch body including a lock receiver; and
a lever for rotating the sliding body between the open position and the closed position, the lever including a lock body movable between an unlocked position and a locked position, wherein the lock body engages the lock receiver in the locked position to prevent the lever from rotating the sliding body to the open position.

11. The computer chassis of claim 1, wherein the latch assembly further comprises:
a latch body supporting the sliding body about the latch pivot;
a lever rotatably coupled to the latch body about the latch pivot for rotating the sliding body between the open position and the closed position, the lever including a capture tab; and
a release tab coupled to the latch body about a release pivot, wherein the release tab is rotatable about the release pivot between a capturing position and a releasing position, wherein the release tab is biased towards the capturing position, wherein the release tab engages the capture tab of the lever when in the capturing position, and wherein the release tab disengages the capture tab of the lever when in the releasing position.

12. A method for assembling a computer chassis, comprising:
providing a chassis base having a bottom surface and a set of sidewalls, the chassis base including a latch receiver coupled to the bottom surface and having a latch receiver channel extending from a latch receiver opening to a latch receiver channel distal end, the chassis base further including receiving slots at upper edges of the set of sidewalls, wherein each receiving slot of the receiving slots comprises a slot channel extending from a slot opening to a slot distal end, and wherein the latch receiver comprises an opening for passing cables from a front end of the latch receiver to a rear end of the latch receiver, the opening positioned between the bottom surface of the chassis base and the latch receiver channel distal end;

providing a top cover, the top cover including a latch assembly having a sliding body rotatable about a latch pivot between an open position and a closed position, the top cover further including a set of bosses corresponding to respective receiving slots of the chassis base;

placing the top cover on the chassis base, wherein placing the top cover on the chassis base comprises inserting each boss of the set of bosses into the slot opening of the respective receiving slot of the chassis base, wherein placing the top cover on the chassis base further comprises inserting the sliding body of the top cover into the latch receiver channel of the chassis base when the sliding body is in the open position, and wherein placing the top cover on the chassis base results in the top cover being in an intermediate position; and securing the top cover by moving the top cover from the intermediate position to a secured position, wherein securing the top cover comprises rotating the sliding body from the open position to the closed position, wherein rotating the sliding body to the closed position causes each boss of the set of bosses to move towards the distal end of the respective receiving slot of the chassis base.

13. The method of claim 12, wherein each receiving slot of the receiving slots comprises a resting surface parallel to the bottom surface of the chassis base, wherein each boss of the set of bosses of the top cover rests upon the resting surface of the respective receiving slot of the chassis base when the top cover is in the intermediate position.

14. The method of claim 12, wherein each receiving slot of the receiving slots is shaped such that rotating the sliding body to the closed position causes the top cover to move towards a front end of the chassis base.

15. The method of claim 12, wherein moving the top cover from the intermediate position to the secured position further comprises sliding a supplemental securement feature into a supplemental receiving slot, wherein the supplemental securement feature extends from an underside of the top cover, wherein the supplemental receiving slot is located on the chassis base, and wherein the supplemental receiving slot is parallel to the bottom surface of the chassis base.

16. The method of claim 12, wherein moving the top cover from the intermediate position to the secured position further comprises sliding a supplemental securement feature into a supplemental receiving slot, wherein the supplemental securement feature is located on a sidewall of the set of sidewalls of the chassis base, and wherein the supplemental receiving slot is located on a bracket extending from an underside of the top cover.

17. The method of claim 12, wherein the latch assembly further comprises a latch body supporting a lever about the latch pivot, the lever coupled to the sliding body for rotating the sliding body between the open position and the closed position, wherein the method further comprises locking the top cover in the secured position by moving a lock body of the lever into a locked position, wherein the lock body of the lever engages a lock receiver of the latch body when the lock body is in the locked position.

18. The method of claim 12, further comprising removing the top cover from the chassis base, wherein removing the top cover from the chassis base comprises:

moving the top cover from the secured position to the intermediate position by rotating the sliding body from the closed position to the open position; and separating the top cover from the chassis base by lifting each boss of the set of bosses out of the respective receiving slot of the chassis base.

19. The method of claim 18, wherein rotating the sliding body from the closed position to the open position further comprises:

depressing a release tab of the latch assembly to disengage a lever of the latch assembly, the lever coupled to the sliding body to rotate the sliding body about the latch pivot; and rotating the lever about the latch pivot to rotate the sliding body towards the open position.

20. A computer chassis, comprising:

a chassis base for receiving a motherboard, the chassis base having a bottom surface and a set of sidewalls, the chassis base further comprising receiving slots at upper edges of the set of sidewalls, wherein each of the receiving slots comprises a slot channel extending from a slot opening to a slot distal end;

a top cover removably couplable to the chassis base, the top cover comprising a set of bosses, wherein each boss of the set of bosses corresponds to a respective receiving slot of the chassis base, the top cover further comprising a latch assembly having a sliding body rotatable about a latch pivot between an open position and a closed position, the top cover further comprising a securement feature extending from an underside of the top cover; and a latch receiver coupled to the bottom surface of the chassis base, the latch receiver having a latch receiver channel extending from a latch receiver opening to a latch receiver channel distal end, wherein the latch receiver further comprises a receiving slot;

wherein the top cover is moveable through an intermediate position between an uncoupled position and a secured position;

wherein, when the top cover is in the uncoupled position, the top cover is not coupled to the chassis base;

wherein, when the top cover is in the intermediate position, i) the sliding body is received by the latch receiver, ii) each boss of the set of bosses is received by the slot opening of the respective receiving slot of the chassis base, and iii) the sliding body is in the open position; and wherein, when the top cover is in the secured position, i) the sliding body is in a closed position, ii) each boss of the set of bosses is located at the slot distal end of the respective receiving slot of the chassis base, and iii) the securement feature of the top cover engages the receiving slot of the latch receiver.

21. The computer chassis of claim 20, wherein the receiving slot of the latch receiver is oriented parallel to the bottom surface of the chassis base.

22. A computer chassis, comprising:

a chassis base for receiving a motherboard, the chassis base having a bottom surface and a set of sidewalls, the chassis base further comprising receiving slots at upper edges of the set of sidewalls, wherein each of the receiving slots comprises a slot channel extending from a slot opening to a slot distal end;

a top cover removably couplable to the chassis base, the top cover comprising a set of bosses, wherein each boss of the set of bosses corresponds to a respective receiving slot of the chassis base, the top cover further comprising a latch assembly, the latch assembly comprising:
  a sliding body rotatable about a latch pivot between an open position and a closed position;
  a latch body supporting the sliding body about the latch pivot, the latch body including a lock receiver; and
  a lever for rotating the sliding body between the open position and the closed position, the lever including a lock body movable between an unlocked position and a locked position, wherein the lock body engages the lock receiver in the locked position to prevent the lever from rotating the sliding body to the open position;
a latch receiver coupled to the bottom surface of the chassis base, the latch receiver having a latch receiver channel extending from a latch receiver opening to a latch receiver channel distal end;
wherein the top cover is moveable through an intermediate position between an uncoupled position and a secured position;
wherein, when the top cover is in the uncoupled position, the top cover is not coupled to the chassis base;
wherein, when the top cover is in the intermediate position, i) the sliding body is received by the latch receiver, ii) each boss of the set of bosses is received by the slot opening of the respective receiving slot of the chassis base, and iii) the sliding body is in the open position; and
wherein, when the top cover is in the secured position, i) the sliding body is in a closed position, and ii) each boss of the set of bosses is located at the slot distal end of the respective receiving slot of the chassis base.

\* \* \* \* \*